(12) United States Patent
Yamazaki

(10) Patent No.: US 9,210,349 B2
(45) Date of Patent: Dec. 8, 2015

(54) A/D CONVERSION CIRCUIT AND SOLID-STATE IMAGING DEVICE

(71) Applicant: OLYMPUS CORPORATION, Tokyo (JP)

(72) Inventor: Susumu Yamazaki, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 204 days.

(21) Appl. No.: 14/083,995

(22) Filed: Nov. 19, 2013

(65) Prior Publication Data

US 2014/0183335 A1   Jul. 3, 2014

(30) Foreign Application Priority Data

Dec. 27, 2012  (JP) ................................. 2012-284604

(51) Int. Cl.
| | |
|---|---|
| *H03M 1/12* | (2006.01) |
| *H04N 5/378* | (2011.01) |
| *H03M 1/14* | (2006.01) |
| *H03M 1/56* | (2006.01) |

(52) U.S. Cl.
CPC ............... *H04N 5/378* (2013.01); *H03M 1/145* (2013.01); *H03M 1/56* (2013.01)

(58) Field of Classification Search
CPC ........ H04N 5/378; H03M 1/145; H03M 1/56; H03M 1/12
USPC ............ 250/208.1, 214 DC; 331/17; 341/155
See application file for complete search history.

(56) References Cited

U.S. PATENT DOCUMENTS

| | | | | |
|---|---|---|---|---|
| 4,649,372 | A | * | 3/1987 | Abe et al. ........................ 341/136 |
| 2008/0272952 | A1 | * | 11/2008 | Wood ............................ 341/166 |
| 2010/0238057 | A1 | * | 9/2010 | Wood ............................ 341/124 |

FOREIGN PATENT DOCUMENTS

JP  2012-39386 A  2/2012

* cited by examiner

*Primary Examiner* — Seung C Sohn
(74) *Attorney, Agent, or Firm* — Westerman, Hattori, Daniels & Adrian, LLP

(57) ABSTRACT

In an A/D conversion circuit and a solid-state imaging device, a latch circuit is in a disable state until a first timing at which an output signal of a comparison unit has been inverted, and is in an enable state until a second timing at which a delay time of the inversion delay circuit has passed from the first timing. The latch circuit is in the enable state until the second timing according to comparison start in the comparison unit. The latch circuit latches an output signal of a delay unit at the second timing. A determination unit determines whether the latch circuit accurately latches the output signal of the delay unit, and outputs a signal indicating a determination result to a delay controller. The delay controller controls the delay time of the inversion delay circuit based on the determination result.

4 Claims, 18 Drawing Sheets

A/D CONVERSION CIRCUIT AND SOLID-STATE IMAGING DEVICE

BACKGROUND OF THE INVENTION

1. Field of the Invention

The present invention relates to an A/D conversion circuit that converts an analog signal into digital data and a solid-state imaging device having the A/D conversion circuit.

The application is based on and claims the benefit of priority from prior Japanese Patent Application No. 2012-284604, filed Dec. 27, 2012, the entire contents of which are incorporated herein.

2. Background Art

As an example of an A/D conversion circuit used in a solid-state imaging device according to the related art, a configuration illustrated in FIG. 14 has been known (for example, Japanese Unexamined Patent Application, First Publication No. 2012-039386). Firstly, the configuration and the operation of the A/D conversion circuit illustrated in FIG. 14 will be described. The A/D conversion circuit illustrated in FIG. 14 includes a comparison unit 11, a signal generation unit 12, a latch unit 13, a counter 14, and a delay unit 15.

The delay unit 15 includes a plurality of delay units DU[0] to DU[7] that delay and output an input signal. A start pulse Start_P is input to the first delay unit DU[0]. The comparison unit 11 includes a voltage comparator COMP that receives an analog signal Sig, which is an object of time detection, and a ramp wave Ramp that decreases with the lapse of time, and outputs an output signal CO indicating a result obtained by comparing the analog signal Sig with a signal voltage of the ramp wave Ramp. In the comparison unit 11, a time interval (a size in the time axis direction) corresponding to the amplitude of the analog signal Sig is generated.

The signal generation unit 12 includes an inversion delay circuit DLY that inverts and delays the output signal CO, and an AND circuit AND1 that outputs an output signal Hold_L obtained by performing an AND operation on the output signal CO and an output signal xCO_D of the inversion delay circuit DLY. The latch unit 13 includes latch circuits D_0 to D_7 that latch the logic states of output signals CK0 to CK7 of the delay units DU[0] to DU[7] of the delay unit 15. Furthermore, the latch unit 13 includes an AND circuit AND2 that outputs an output signal Hold_C, which is obtained by performing an AND operation on the output signal xCO_D of the inversion delay circuit DLY of the signal generation unit 12 and a control signal Enable1, to the latch circuit DU[7]. The counter 14 includes a counter circuit CNT that performs counting based on the output signal CK7 that is input from the delay unit 15 through the latch circuit D_7.

The latch circuits D_0 to D_6 changes to an enable (valid) state when the output signal Hold_L is in a High state (a logic value "1"), and output the output signals CK0 to CK6 of the delay units DU[0] to DU[6]. Furthermore, the latch circuits D_0 to D_6 changes to a disable (invalid) state when the output signal Hold_L is in a Low state (a logic value "0"), and latch logic states corresponding to the output signals CK0 to CK6 of the delay units DU[0] to DU[6].

The latch circuit D_7 changes to the enable (valid) state when the output signal Hold_C is in the High state, and outputs the output signal CK7 of the delay unit DU[7]. Furthermore, the latch circuit D_7 changes to the disable (invalid) state when the output signal Hold_C is in the Low state, and latches a logic state corresponding to the output signal CK7 of the delay unit DU[7].

A counter latch circuit that latches the logic state of a counting result of the counter 14 is not illustrated. However, a counter circuit having a latch function is used, so that the counter 14 is also used as the counter latch circuit.

Next, an operation of the related art will be described. FIG. 15 illustrates the operation of the A/D conversion circuit according to the related art.

FIG. 15 illustrates waveforms of the ramp wave Ramp, the analog signal Sig, the start pulse Start_P, the output signals CK0 to CK7 of the delay units DU[0] to DU[7], the output signal CO of the comparison unit 11, the output signal xCO_D of the inversion delay circuit DLY, the output signal Hold_L of the AND circuit AND1, the control signal Enable1, the output signal Hold_C of the AND circuit AND2, and the signals Q0 to Q7 output from the latch circuits D_0 to D_7 from the top. In FIG. 15, the vertical direction indicates signal voltage and the horizontal direction indicates time.

Firstly, at a timing (a first timing) according to the comparison start of the comparison unit 11, a clock of a cycle approximately coinciding with a delay time (the sum of delay times of the eight delay units DU[0] to DU[7]) of the delay unit 15 is input to the delay unit 15 as the start pulse Start_P. In this way, the delay unit 15 starts to operate. The delay unit DU[0] constituting the delay unit 15 delays the start pulse Start_P and outputs the output signal CK0, and the delay units DU[1] to DU[7] constituting the delay unit 15 delay output signals of delay units of a previous stage and output the output signals CK1 to CK7. The output signals CK0 to CK7 of the delay units DU[0] to DU[7] are input to the latch circuits D_0 to D_7 of the latch unit 13. At this time, since the output signal CO of the comparison unit 11 is in the Low state and the output signal xCO_D of the inversion delay circuit DLY is in the High state, the output signal Hold_L of the AND circuit AND1 of the signal generation unit 12 changes to the Low state and the latch circuits D_0 to D_6 are in the disable state, so that the A/D conversion circuit stops operating.

Meanwhile, since the output signal xCO_D of the inversion delay circuit DLY is in the High state and the control signal Enable1 is in the High state, the output signal Hold_C of the AND circuit AND2 of the latch unit 13 changes to the High state, so that the latch circuit D_7 changes to the enable state and outputs the input output signal CK7 of the delay unit DU[7] to the counter 14 as is.

The counter 14 performs a counting operation based on the output signal CK7 of the delay unit DU[7], which is output from the latch circuit D_7 of the latch unit 13. In the counting operation, a count value increases or decreases with the rise or the fall of the output signal CK7.

At a timing (a second timing) at which the analog signal Sig approximately coincides with the signal voltage of the ramp wave Ramp, since the output signal CO of the comparison unit 11 is inverted, the output signal Hold_L of the AND circuit AND1 of the signal generation unit 12 changes to the High state. In this way, the latch circuits D_0 to D_6 change to the enable state. After the lapse of a time coinciding with a delay time of the inversion delay circuit DLY of the signal generation unit 12 from the second timing (at a third timing), since the output signal xCO_D of the inversion delay circuit DLY of the signal generation unit 12 is inverted, the output signal Hold_L of the AND circuit AND1 of the signal generation unit 12 changes to the Low state. In this way, the latch circuits D_0 to D_6 change to the disable state. At this time, the logic states corresponding to the output signals CK0 to CK6 of the delay units DU[0] to DU[6] are latched by the latch circuits D_0 to D_6. Furthermore, since the output signal Hold_C of the AND circuit AND2 of the latch unit 13 changes to the Low state at the third timing, the latch circuit D_7 changes to the disable state and the logic state corresponding to the output signal CK7 of the delay unit DU[7] is latched by the latch circuit D_7. In the case of FIG. 15, the logic states of the signals latched by the latch circuits D_0 to D_7 are $(11100001)_2$=(D_7=1, D_6=1, D_5=1, D_4=0, D_3=0, D_2=0, D_1=0, and D_0=1) ("0" corresponds to a Low state and "1" corresponds to a High state). In the present specification, $(*)_2$ (* is a sequence of 0 and 1) indicates a binary number.

The counter 14 latches a count value when the latch circuit D_7 stops operating. By the logical state latched in the latch unit 13 and the count value latched in the counter 14, digital data corresponding to the analog signal Sig is obtained.

In accordance with the A/D conversion circuit according to the related art, since the latch circuits D_0 to D_6 operate only during a period from the second timing to the third timing, it is possible to reduce current consumption of the latch unit, resulting in the reduction of current consumption of the A/D conversion circuit.

FIG. 16 illustrates an example of the configuration of the latch circuits D_0 to D_7 provided in the latch unit 13. As illustrated in FIG. 16, each of the latch circuits D_0 to D_7 includes a NAND circuit NAND1, inversion circuits NOT1 and NOT2, and a switch circuit SW. The switch circuit SW further includes switch circuits L_SW1 and L_SW2.

One input terminal (a first input terminal) of the NAND circuit NAND1 is connected to an input terminal D. The other input terminal of the NAND circuit NAND1 is connected to an input terminal SET (a second input terminal). One end of the switch circuit L_SW1 is connected to an output terminal of the NAND circuit NAND1. The other end of the switch circuit L_SW1 is connected to an input terminal of the inversion circuit NOT1 and one end of the switch circuit L_SW2. An input terminal of the inversion circuit NOT2 is connected to an output terminal of the inversion circuit NOT1. The other end of the switch circuit L_SW2 is connected to an output terminal of the inversion circuit NOT2 and an output terminal Q.

When an input signal of the input terminal SET of each of the latch circuits D_0 to D_7 is in the Low state, since an output signal of the NAND circuit NAND1 changes to the High state regardless of the logic state of an input signal of the input terminal D, the latch circuits D_0 to D_7 change to the disable state. Furthermore, when the input signal of the input terminal SET of each of the latch circuits D_0 to D_7 is in the High state, since the NAND circuit NAND1 inverts and outputs the logic state of the input signal of the input terminal D, the latch circuits D_0 to D_7 change to the enable state.

A control terminal CK' of the switch circuits L_SW1 and L_SW2 is connected to an input terminal CK, and the switch circuits L_SW1 and L_SW2 are controlled by an input signal of the input terminal CK. The switch circuit L_SW1 is turned ON when the input signal of the input terminal CK is in the High state, and is turned OFF when the input signal of the input terminal CK is in the Low state. The switch circuit L_SW2 is turned ON when the input signal of the input terminal CK is in the Low state, and is turned OFF when the input signal of the input terminal CK is in the High state.

The output signal Hold_L of the AND circuit AND1 is input to the input terminals CK and SET of the latch circuits D_0 to D_6, and the output signals CK0 to CK6 of the delay units DU[0] to DU[6] are input to the input terminals D of the latch circuits D_0 to D_6. Meanwhile, the output signal Hold_C of the AND circuit AND2 is input to the input terminal CK of the latch circuits D_7, and a power supply voltage is input to the input terminal SET of the latch circuits D_7. The output signal CK7 of the delay units DU[7] is input to the input terminal D of the latch circuits D_7.

FIG. 17 illustrates the operation of the latch circuits D_0 to D_6 when the latch circuits D_0 to D_6 are in an ideal state in which there is no reduction of a power supply voltage and no increase in a ground voltage, and FIG. 18 illustrates the operation of the latch circuits D_0 to D_6 when the reduction of the power supply voltage and the increase in the ground voltage occur in the latch circuits D_0 to D_6. FIG. 17 and FIG. 18 illustrate the waveforms of the input signals of the input terminals CK, SET, and D of each of the latch circuits D_0 to D_6, the output signal of the NAND circuit NAND1, and the output signal of the output terminal Q from the top. In FIG. 17 and FIG. 18, the vertical direction indicates a signal voltage and the horizontal direction indicates a time. VDD indicates the power supply voltage and GND indicates the ground voltage.

When the power supply voltage and the ground voltage of the latch circuits D_0 to D_6 are in an ideal state, the NAND circuit NAND1 inverts and outputs the logic state of the input signal of the input terminal D immediately at the timing at which the input signal (the output signal Hold_L of the AND circuit AND1) of the input terminals CK and SET changes from the Low state to the High state, and the latch circuits D_0 to D_6 change to the enable state, as illustrated in FIG. 17. Then, the latch circuits D_0 to D_6 hold a signal (the Low state in FIG. 17) obtained by inverting the input signal D at the timing at which the input signal (the output signal Hold_L of the AND circuit AND1) of the input terminals CK and SET change from the High state to the Low state.

However, when the reduction of the power supply voltage and the increase in the ground voltage occur in the latch circuits D_0 to D_6, since the operation of each circuit constituting the latch circuits D_0 to D_6 is delayed, the NAND circuit NAND1 may not be able to invert and output the logic state of the input signal of the input terminal D immediately at the timing at which the input signal (the output signal Hold_L of the signal generation unit 12) of the input terminal SET changes from the Low state to the High state, as illustrated in FIG. 18. In this case, also at the timing at which the input signal (the output signal Hold_L of the AND circuit AND1) of the input terminal CK changes from the High state to the Low state, since the output signal of the NAND circuit NAND1 does not change to the Low state, the latch circuits D_0 to D_6 may hold a signal (the High state in FIG. 18) equal to the input signal D.

As one method for performing encoding (binarization) of the logic states latched in the latch circuits D_0 to D_7, there is a method for outputting an encoded value, which corresponds to a position at which the logic states of signals latched in the latch circuits D_0 to D_7 are switched from 0 to 1 (or from 1 to 0), when the logic states of the signals are viewed in the same direction in an arrangement order of the latch circuits D_0 to D_7. In the operation illustrated in FIG. 15, when the aforementioned abnormal operation does not occur in the latch circuit D_6 of the AD conversion circuit, the logic states of the signals latched in the latch circuits D_0 to D_7 are $(11100001)_2$=(D_7=1, D_6=1, D_5=1, D_4=0, D_3=0, D_2=0, D_1=0, and D_0=1) ("0" corresponds to the Low state and "1" corresponds to the High state) as described above. In this case, since there is only one position at which the logic states of the signals latched in the latch circuits D_0 to D_7 are switched from 0 to 1, encoding is correctly performed.

Meanwhile, in the operation illustrated in FIG. 15, when the aforementioned abnormal operation occurs in the latch circuit D_6 of the AD conversion circuit, the logic states of the signals latched in the latch circuits D_0 to D_7 are $(10100001)_2$=(D_7=1, D_6=0, D_5=1, D_4=0, D_3=0, D_2=0, D_1=0, and D_0=1) ("0" corresponds to the Low state and "1" corresponds to the High state). In this case, when encoding is performed using the aforementioned method, there are two positions at which the logic states of the signals latched in the latch circuits D_0 to D_7 are switched from 0 to 1. As described above, when there are two positions at which the logic states of the signals latched in the latch circuits D_0 to D_7 are switched from 0 to 1, it causes incorrect encoding, resulting in a possibility of an error of 1 LSB or more occurring.

SUMMARY OF THE INVENTION

According to a first aspect the present invention, an A/D conversion circuit includes: a comparison unit that receives an analog signal and a reference signal that increases or decreases with lapse of time, compares the analog signal with the reference signal, and outputs a first comparison signal at a first timing at which the analog signal and the reference signal have a predetermined relation; a signal generation unit that outputs a second comparison signal, a logic state of which changes, at a second timing at which a predetermined time has lapsed from the first timing, and outputs a third comparison signal, a logic state of which changes, at the first timing and the second timing based on a result obtained by performing a logic operation on the first comparison signal and the second comparison signal; a clock generation unit that outputs n clock signals from a first clock signal to an n-th (n is a natural number greater than or equal to 2) clock signal, which have different phases from each other, a latch unit that includes n latch units from a first latch unit to an n-th latch unit, each latch unit having a first input terminal to which a corresponding one of the n clock signals from the first clock signal to the n-th clock signal is input, a second input terminal to which a control signal entering a first logic state corresponding to a valid state of a latch unit and a second logic state corresponding to an invalid state of a latch unit is input based on the second comparison signal or the third comparison signal, and an output terminal; a counter that performs counting based on a signal from the one output terminal of k latch units from an (n−k+1)th (k is a natural number greater than or equal to 1 and smaller than or equal to n−1) latch unit to the n-th latch unit; a determination unit that determines a logic state of the clock signal latched in the latch unit based on at least one of signals from the output terminals of (n−k) latch units from the first latch unit to an (n−k)th latch unit, and outputs a determination signal; and a time controller that controls a length of the predetermined time based on the determination signal, wherein the control signal, which is input to the (n−k) latch units from the first latch unit to the (n−k)th latch unit, is in the second logic state from a timing according to comparison start in the comparison unit to the first timing based on the third comparison signal, and is in the first logic state from the first timing to the second timing based on the third comparison signal, a control signal, which is input to the k latch units from the (n−k+1)th latch unit to the n-th latch unit, is in the first logic state from the timing according to the comparison start in the comparison unit to the second timing based on the second comparison signal, and the n latch units from the first latch unit to the n-th latch unit latch logic states of the n clock signals at the second timing.

Furthermore, according to a second aspect the present invention, a solid-state imaging device includes: an imaging unit that includes a plurality of pixels arranged in a matrix form to output a pixel signal in response to an amount of incident light; and the A/D conversion circuits according to claim 1 that are arranged for each column or each of a plurality of columns of the imaging unit, the analog signal being a signal corresponding to the pixel signal, wherein the time controller controls a length of the predetermined time of all columns based on the determination signal.

Furthermore, according to a third aspect the present invention, a solid-state imaging device includes: an imaging unit that includes a plurality of pixels arranged in a matrix form to output a pixel signal in response to an amount of incident light; and the A/D conversion circuits according to claim 1 that are arranged for each column or each of a plurality of columns of the imaging unit, the analog signal being a signal corresponding to the pixel signal, wherein the time controller controls a length of the predetermined time of the A/D conversion circuits of the plurality of columns, which include a column from which the determination signal is output, based on the determination signal.

Furthermore, according to a fourth aspect the present invention, a solid-state imaging device includes: an imaging unit that includes a plurality of pixels arranged in a matrix form to output a pixel signal in response to an amount of incident light; and the A/D conversion circuits according to claim 1 that are arranged in for each column or each of a plurality of columns of the imaging unit, the analog signal being a signal corresponding to the pixel signal, wherein the time controller controls a length of the predetermined time of the A/D conversion circuits of a column, from which the determination signal is output, based on the determination signal.

DETAILED DESCRIPTION OF THE INVENTION

Hereinafter, with reference to the accompanying drawings, embodiments of the present invention will be described.

First Embodiment

Figure 1:
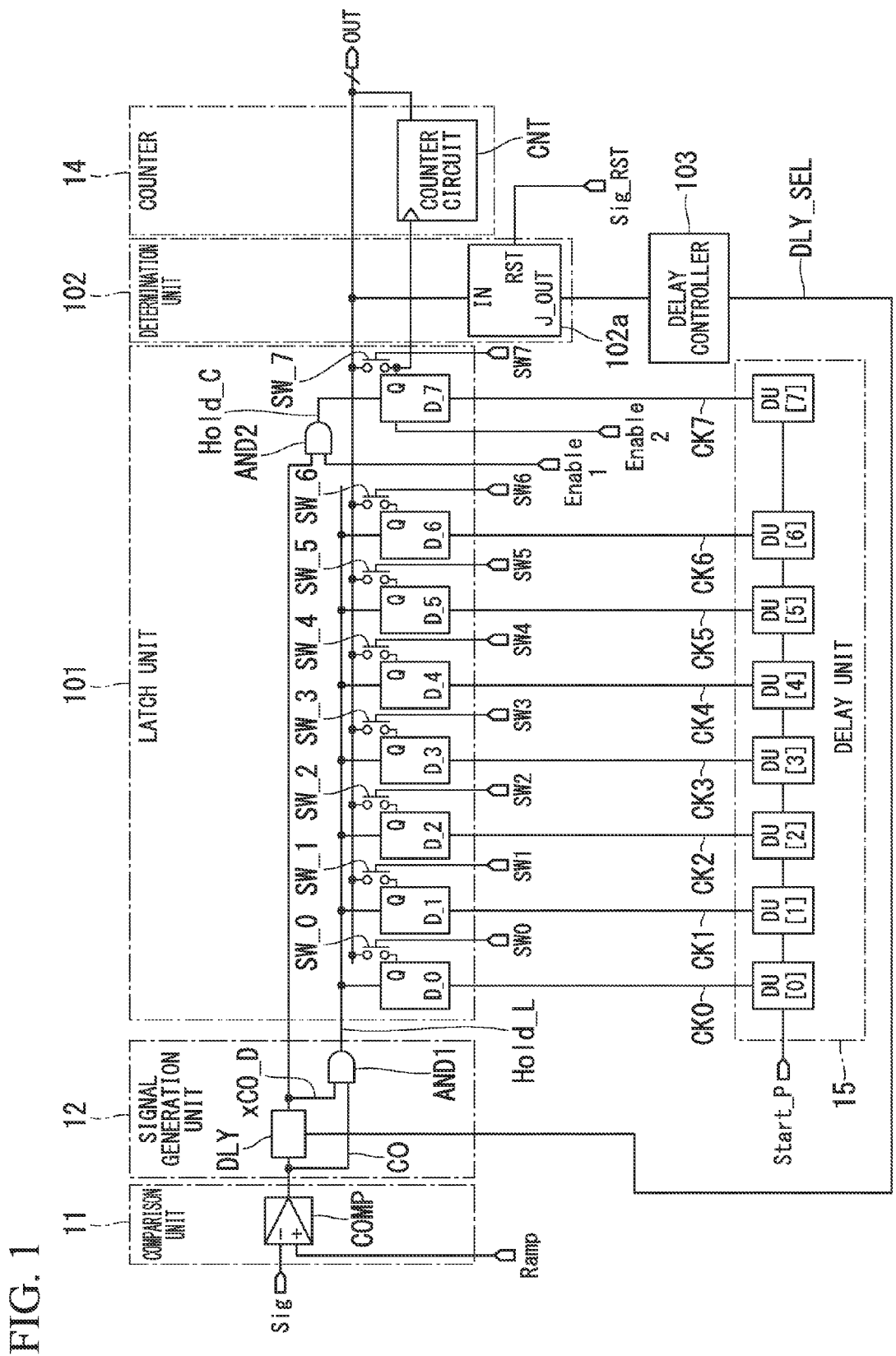
FIG. 1 is a block diagram illustrating the configuration of an A/D conversion circuit according to a first embodiment of the present invention.

Firstly, a first embodiment of the present invention will be described. FIG. 1 illustrates an example of the configuration of an A/D conversion circuit according to the present embodiment. Hereinafter, the configuration of the present example will be described. The A/D conversion circuit illustrated in FIG. 1 includes a comparison unit 11, a signal generation unit 12, a latch unit 101, a determination unit 102, a counter 14, a delay unit 15 (a clock generation unit), and a delay controller 103 (a time controller).

The delay unit 15 (the clock generation unit) includes a plurality of delay units DU[0] to DU[7] that delay and output an input signal. The delay units DU[0] to DU[7] are serially connected to one another in sequence of the delay unit DU[0], the delay unit DU[1], the delay unit DU[2], ... , and the delay unit DU[7], and a start pulse Start_P is input to the first delay unit DU[0]. The delay unit DU[0] delays and outputs the input start pulse Start_P, and the delay units DU[1] to DU[7] delay and output the output signals of delay units of a respective previous stage. Through this configuration, the delay units DU[0] to DU[7] output output signals CK0 to CK7 that are clock signals having different phases from one another.

Figure 2:
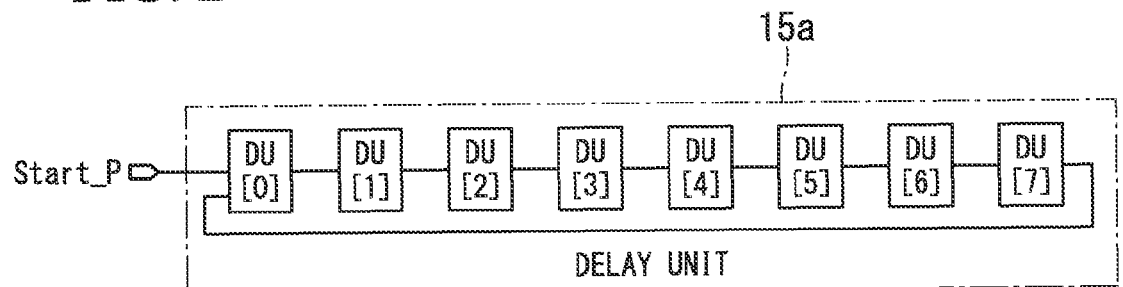
FIG. 2 is a block diagram illustrating the configuration of a delay unit provided in an A/D conversion circuit according to a first embodiment of the present invention.

As the delay unit 15, instead of the configuration illustrated in FIG. 1, a ring-like delay circuit, in which the plurality of delay units DU[0] to DU[7] are connected to one another in a ring shape, may be used. FIG. 2 illustrates an example in which the delay unit is configured as the ring-like delay circuit. In a delay unit 15a illustrated in FIG. 2, the output signal of the delay unit DU[7] is input to the delay unit DU[0]. The delay unit 15a starts to operate when the logic state of the start pulse Start_P is changed from a Low state to a High state.

The comparison unit 11 includes a voltage comparator COMP that receives an analog signal Sig, which is an object of detection, and a ramp wave Ramp that increases or decreases with the lapse of time, and outputs an output signal CO (a first comparison signal) indicating a result obtained by comparing the analog signal Sig with a signal voltage of the ramp wave Ramp. In this way, a time interval corresponding to the amplitude of the analog signal Sig is generated.

The signal generation unit 12 generates a control signal that controls the operations of the latch unit 101 and the counter 14. The signal generation unit 12 includes an inversion delay circuit DLY that inverts and delays the output signal CO, and an AND circuit AND1 that outputs an output signal Hold_L (a third comparison signal) obtained by performing an AND operation on the output signal CO and an output signal xCO_D (a second comparison signal) of the inversion delay circuit DLY. Furthermore, the inversion delay circuit DLY receives a control signal DLY_SEL from the delay controller 103, and the delay time of the inversion delay circuit DLY is changed according to the logic state of the control signal DLY_SEL. In detail, when the control signal DLY_SEL of the delay controller 103 is in the Low state, the delay time of the inversion delay circuit DLY is tDLY1, and when the control signal DLY_SEL of the delay controller 103 is in the High state, the delay time of the inversion delay circuit DLY is tDLY2 (tDLY1<tDLY2). Through this configuration, the signal generation unit 12 generates a control signal for allowing latch circuits D_0 to D_6 of the latch unit 101 to be in an enable (valid) state at a first timing after the start pulse StartP is input, and the latch circuits D_0 to D_7 and the counter 14 to perform latching at a second timing after a predetermined time lapses from the first timing.

The latch unit 101 includes the latch circuits D_0 to D_7 (latch units), an AND circuit AND2, and switch circuits SW_0 to SW_7. The latch circuits D_0 to D_7 latch the logic states of the output signals CK0 to CK7 of the delay units DU[0] to DU[7] of the delay unit 15. The AND circuit AND2 outputs, to the latch circuit D_7, an output signal Hold_C obtained by performing an AND operation on an output signal xCO_D of the inversion delay circuit DLY of the signal generation unit 12 and a control signal Enable1. The switch circuits SW_0 to SW_7 sequentially transmit signals latched in the latch circuits D_0 to D_7. The states of the switch circuits SW_0 to SW_7 are controlled by control signals SW0 to SW7. The counter 14 includes a counter circuit CNT that performs counting based on the output signal CK7 that is input from the delay unit 15 through the latch circuit D_7.

The determination unit 102 determines the logic states of the signals latched in the latch circuits D_0 to D_7, thereby determining whether the latch circuits D_0 to D_7 accurately latch the output signals CK0 to CK7 of the delay units DU[0] to DU[7] and outputting a signal (a determination signal) indicating a result of the determination to the delay controller 103. Based on the signal from the determination unit 102, the delay controller 103 generates the control signal DLY_SEL that controls the delay time of the inversion delay circuit DLY, and outputs the control signal DLY_SEL to the inversion delay circuit DLY.

Figure 16:
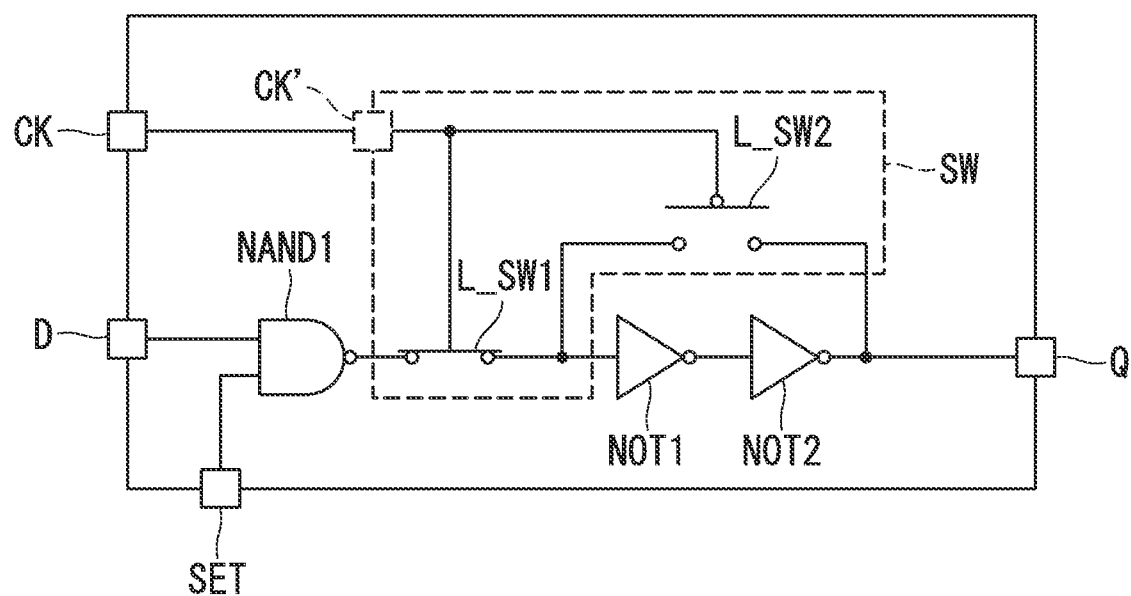
FIG. 16 is a circuit diagram illustrating the configuration of a latch circuit.

Since the configuration of the latch circuits D_0 to D_7 constituting the latch unit 101 is the same as the configuration illustrated in FIG. 16, a detailed description of the configuration of the latch circuits D_0 to D_7 will be omitted. The output signal Hold_L of the AND circuit AND1 is input to input terminals CK and SET of each of the latch circuits D_0 to D_6 of the present embodiment. Furthermore, the output signals CK0 to CK6 of the delay units DU[0] to DU[6] are input to an input terminal D of each of the latch circuits D_0 to D_6. The latch circuits D_0 to D_6 change to an enable (valid) state when the output signal Hold_L of the AND circuit AND1 is in a High state (a logic value "1": a first logic state), and output the output signals CK0 to CK6 of the delay units DU[0] to DU[6]. Furthermore, the latch circuits D_0 to D_6 change to a disable (invalid) state when the output signal Hold_L of the AND circuit AND1 is in a Low state (a logic value "0": a second logic state), and latch logic states corresponding to the output signals CK0 to CK6 of the delay units DU[0] to DU[6].

Meanwhile, an output signal Hold_C of the AND circuit AND2 is input to an input terminal CK of the latch circuit D_7 of the present embodiment, and a control signal Enable2 is input to an input terminal SET of the latch circuit D_7. Furthermore, the output signal CK7 of the delay unit DU[7] is input to an input terminal D of the latch circuit D_7. The latch circuit D_7 changes to the enable state when the control signal Enable2 is in the High state (the first logic state), and outputs the output signal CK7 of the delay unit DU[7] when the output signal Hold_C of the AND circuit AND2 is in the High state. When the output signal Hold_C of the AND circuit AND2 is transitioned from the High state to the Low state, the latch circuit D_7 latches a logic state corresponding to the output signal CK7 of the delay unit DU[7] at that time. The latch circuit D_7 changes to the disable state when the control signal Enable2 is transitioned from the High state to the Low state.

Figure 17:
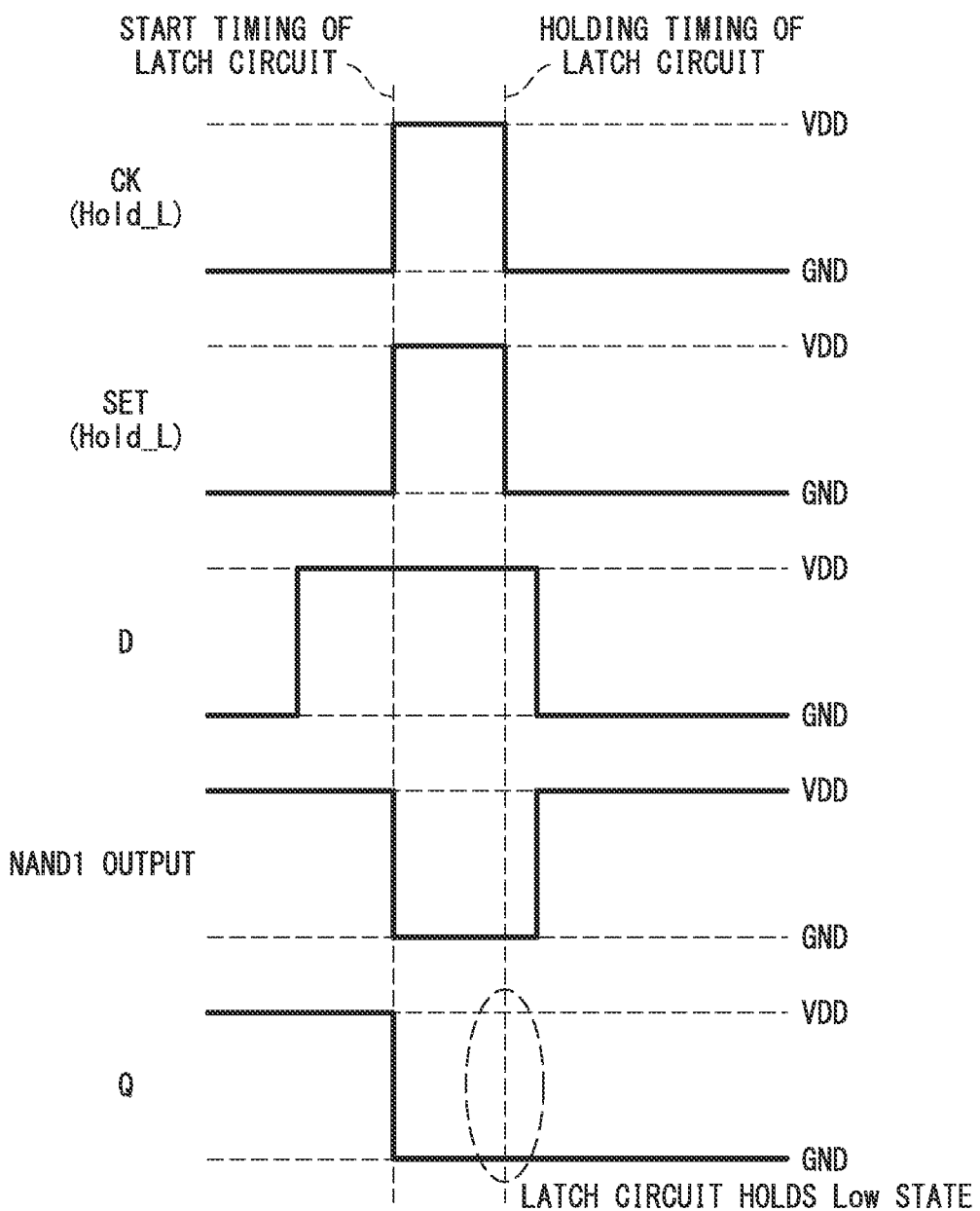
FIG. 17 is a timing chart illustrating the operation of a latch circuit.
Figure 18:
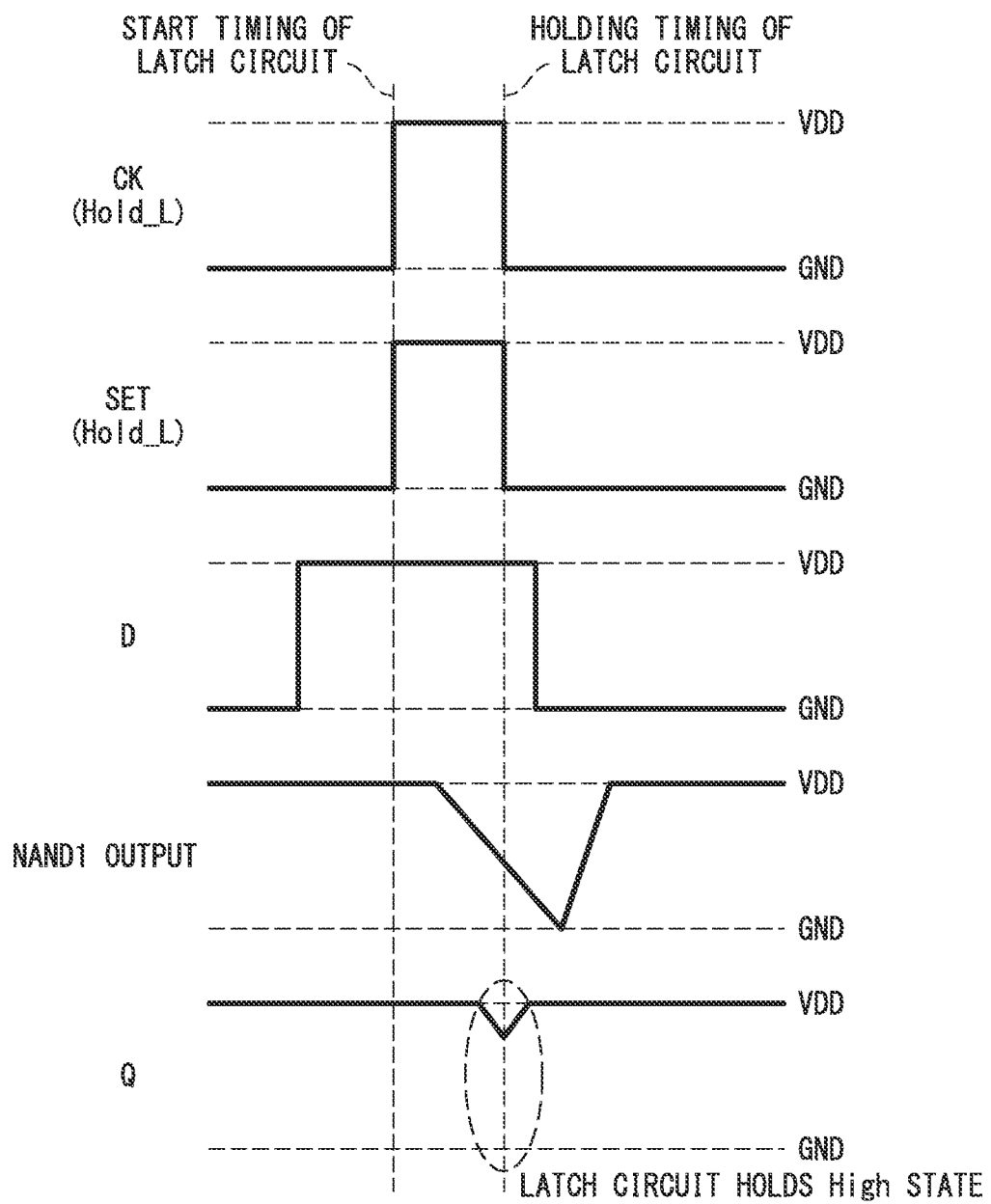
FIG. 18 is a timing chart illustrating the operation of a latch circuit.
Figure 19:
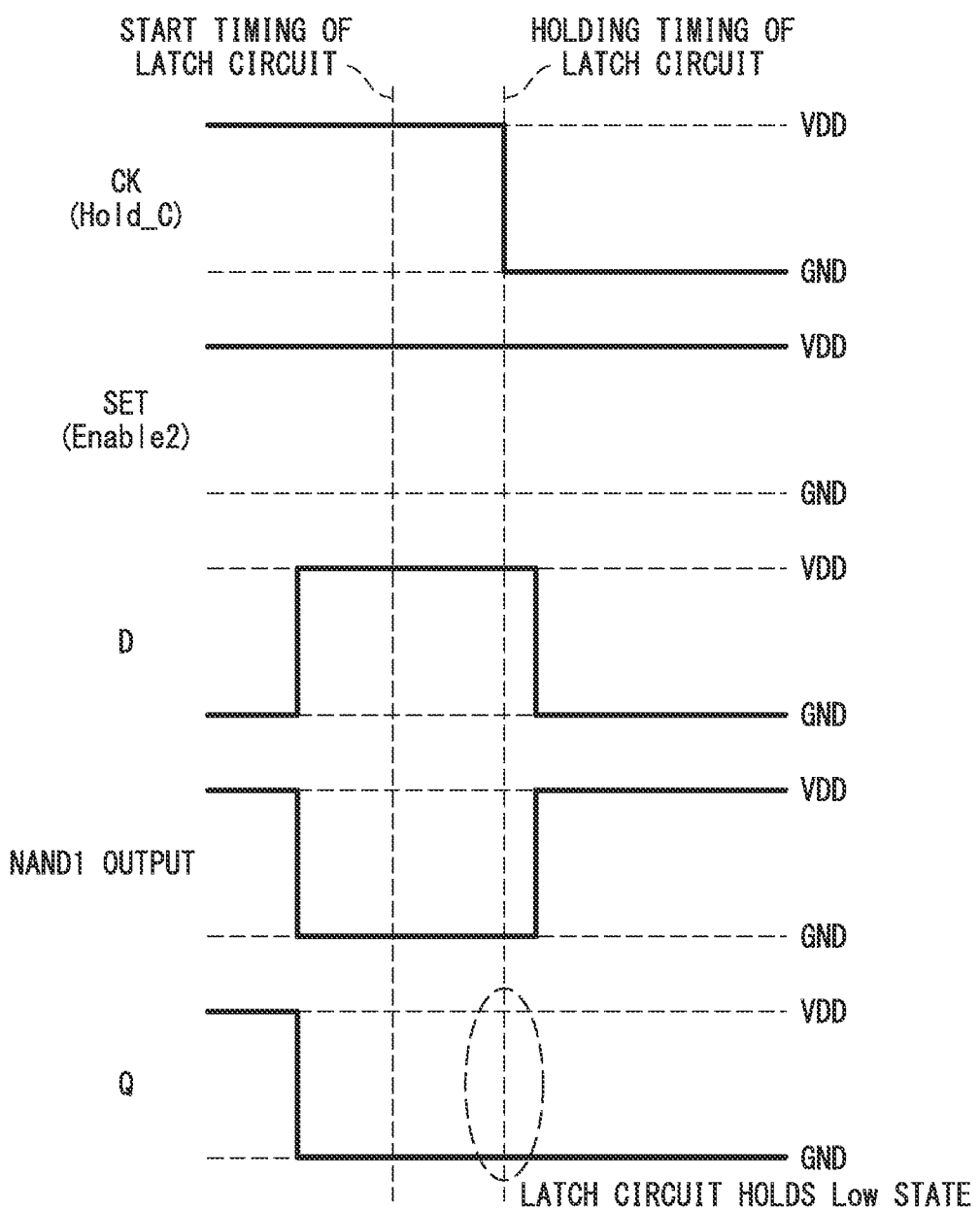
FIG. 19 is a timing chart illustrating the operation of a latch circuit.

Since the operation of the latch circuits D_0 to D_6 has been described in FIG. 17 and FIG. 18, a description of the operation of the latch circuits D_0 to D_6 will be omitted here. FIG. 19 illustrates the operation of the latch circuit D_7.

FIG. 19 illustrates waveforms of the input signals of the input terminals CK, SET, and D of the latch circuit D_7, the output signal of the NAND circuit NAND1, and the output signal of the output terminal Q from the top. In FIG. 19, the vertical direction indicates signal voltage and the horizontal direction indicates time. VDD indicates the power supply voltage and GND indicates the ground voltage.

As illustrated in FIG. 19, while the input signal (the control signal Enable2) of the input terminal SET is in the High state, the latch circuit D_7 is in the enable state. The latch circuit D_7 holds a signal (the Low state in FIG. 19) obtained by inverting the input signal D at a timing at which the input signal (the output signal Hold_C of the AND circuit AND2) of the input terminal CK changes to the Low state from the High state.

Figure 3:
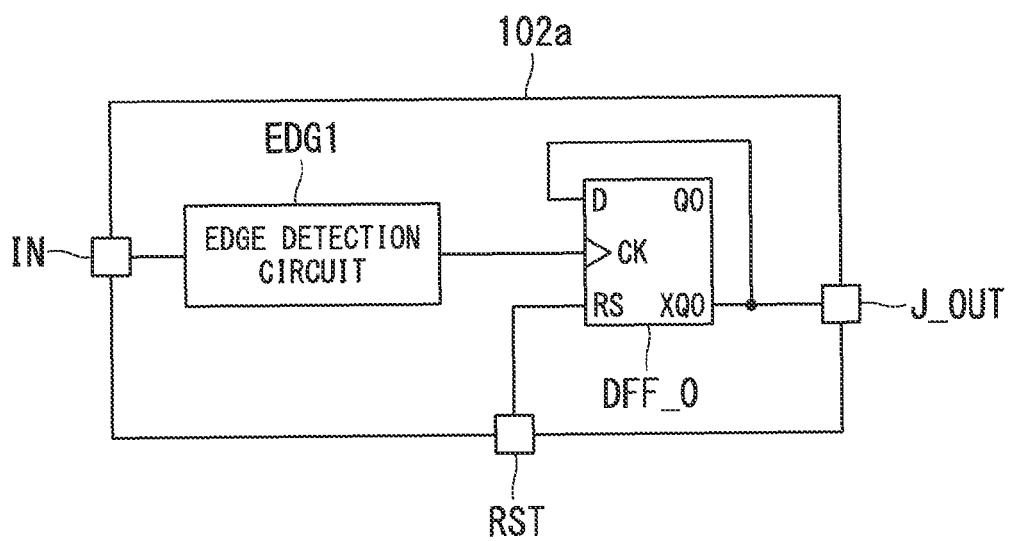
FIG. 3 is a block diagram illustrating the configuration of a determination circuit provided in an A/D conversion circuit according to a first embodiment of the present invention.

FIG. 3 illustrates an example of the configuration of a determination circuit 102a of the determination unit 102. The determination circuit 102a includes an edge detection circuit EDG1 and a latch circuit DFF_0. An input terminal of the edge detection circuit EDG1 is connected to an input terminal IN. The edge detection circuit EDG1 detects switching from the Low state to the High state (or switching from the High state to the Low state) of the input signal of the input terminal IN, and outputs a result of the detection to the latch circuit DFF_0.

An input terminal RS of the latch circuit DFF_0 is connected to an input terminal RST. A control signal Sig_RST (FIG. 1) is input to the input terminal RST. When an input signal of the input terminal RST is in the Low state, since the output signal of an output terminal Q0 of the latch circuit DFF_0 changes to the Low state and the output signal of an output terminal XQ0 changes to the High state regardless of the logic state of an input signal of an input terminal D of the latch circuit DFF_0, the latch circuit DFF_0 changes to the disable state. When the input signal of the input terminal RST is in the High state, since the output signal of the output terminal Q0 changes to the Low state or the High state and the output signal of the output terminal XQ0 changes to the High state or the Low state according to the logic states of input signals of the input terminals CK and D of the latch circuit DFF_0, the latch circuit DFF_0 changes to the enable state.

When the input signal of the input terminal CK changes to the High state from the Low state, the latch circuit DFF_0 outputs a signal in a logic state, which is the same as the logic state of the input signal of the input terminal D, from the output terminal Q0, and outputs a signal in a logic state, which is obtained by inverting the logic state of the input signal of the input terminal D, from the output terminal XQ0. The output terminal XQ0 of the latch circuit DFF_0 is connected to an output terminal J_OUT that outputs an output signal Jout to the delay controller 103. The determination unit 102 outputs an output signal Jout in the Low state when the latch circuits D_0 to D_7 accurately latch the output signals CK0 to CK7 of the delay units DU[0] to DU[7], and outputs an output signal Jout in the High state when the latch circuits D_0 to D_7 do not accurately latch the output signals CK0 to CK7 of the delay units DU[0] to DU[7], which will be described later.

FIG. 3 does not explicitly show a counter latch circuit that latches the logic state of the counting result of the counter 14. However, a counter circuit having a latch function is used, so that the counter circuit is also used as the counter latch circuit. The present configuration is for illustrative purposes only, and the present invention is not limited thereto.

Figure 4:
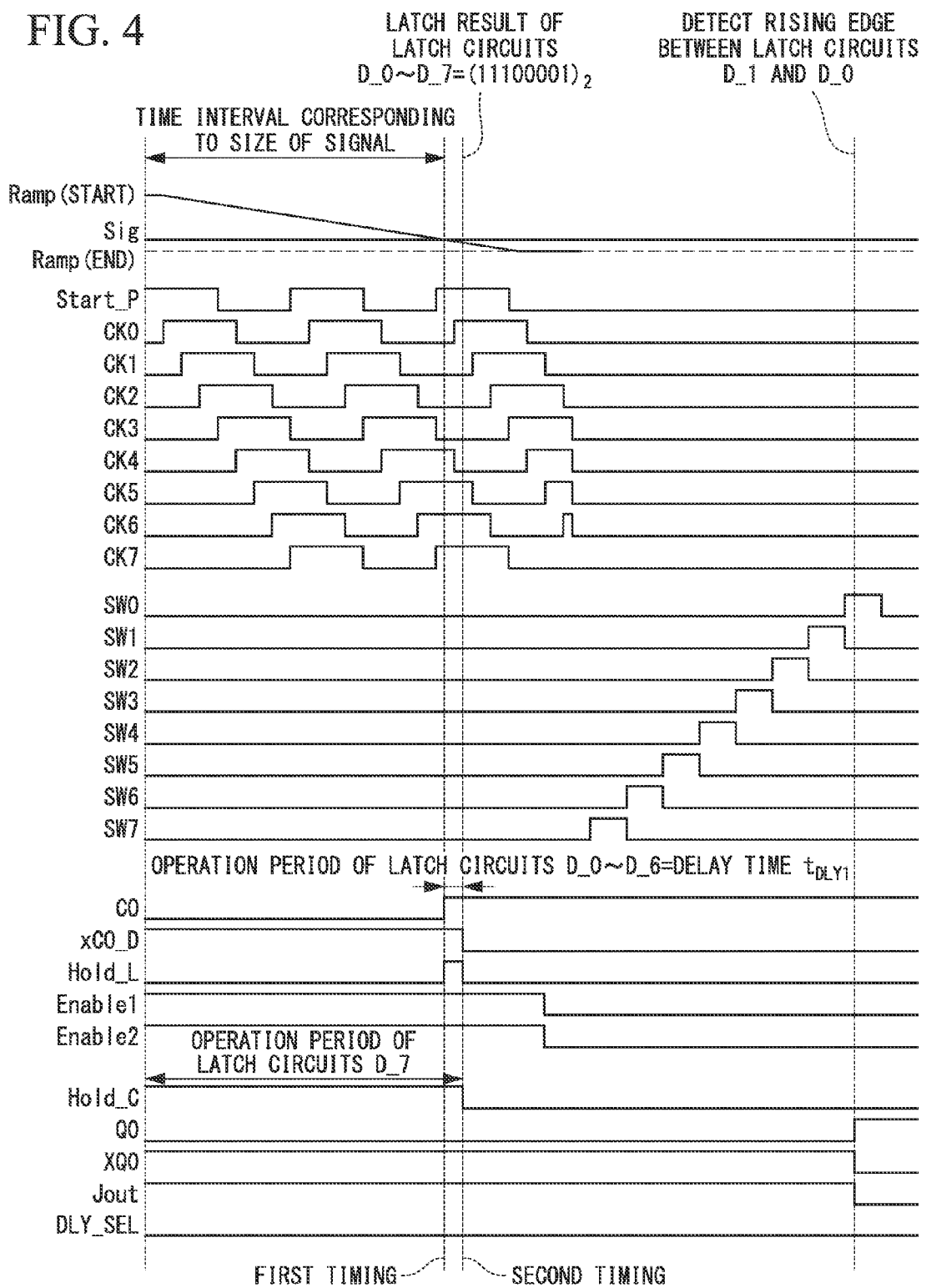
FIG. 4 is a timing chart illustrating the operation of an A/D conversion circuit according to a first embodiment of the present invention.
Figure 5:
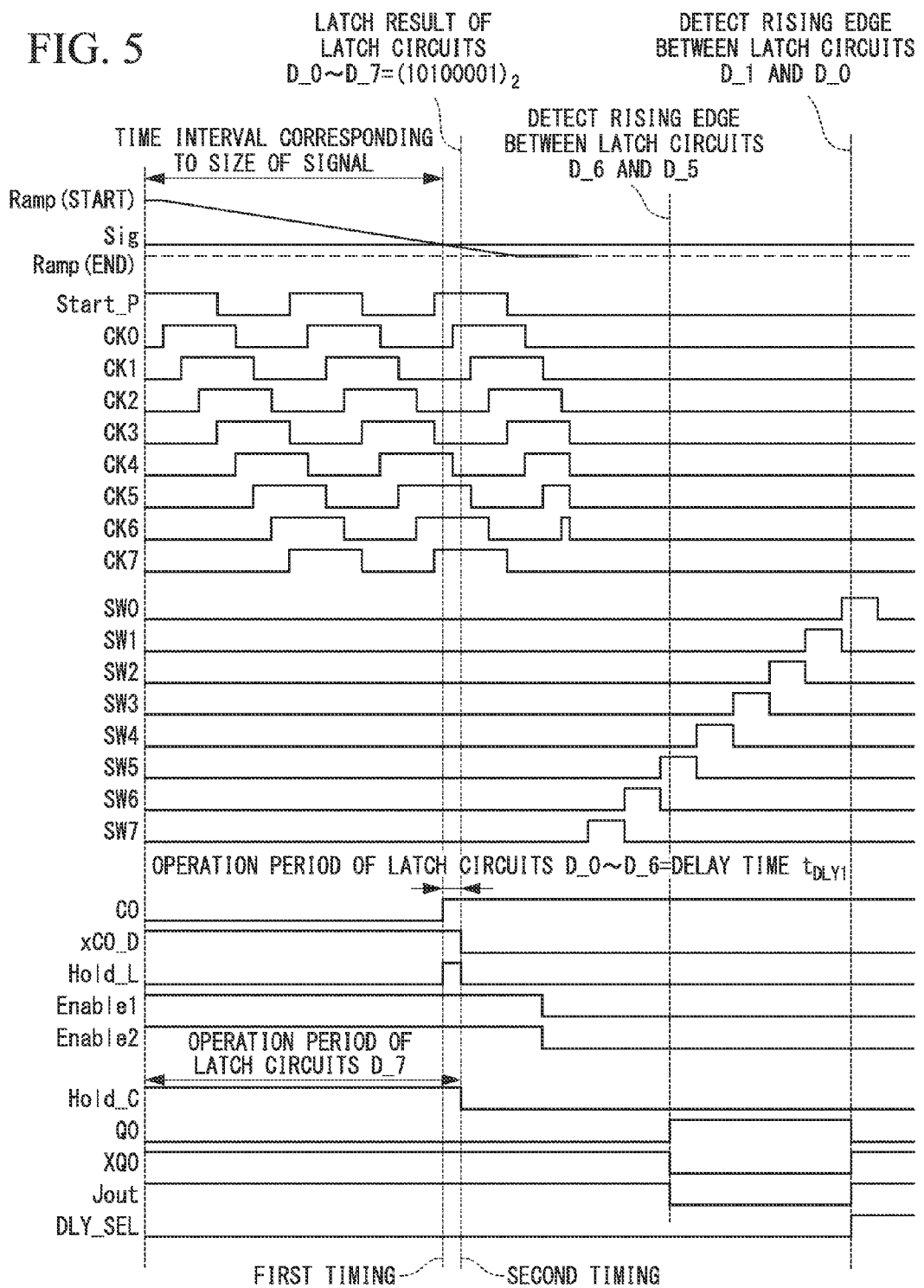
FIG. 5 is a timing chart illustrating the operation of an A/D conversion circuit according to a first embodiment of the present invention.

Next, an operation of the present embodiment will be described. FIG. 4 and FIG. 5 illustrate the operation of the A/D conversion circuit according to the present embodiment. FIG. 4 and FIG. 5 illustrate waveforms of the ramp wave Ramp, the analog signal Sig, the start pulse Start_P, the output signals CK0 to CK7 of the delay units DU[0] to DU[7], the control signals SW0 to SW7 for controlling the switching circuits SW_0 to SW_7, the output signal CO of the comparison unit 11, the output signal xCO_D of the inversion delay circuit DLY, the output signal Hold_L of the AND circuit AND1, the control signals Enable1 and Enable2, the output signal Hold_C of the AND circuit AND2, the output signals of the output terminals Q0 and XQ0 of the latch circuit DFF_0, the output signal Jout of the determination unit 102, and the control signal DLY_SEL of the delay controller 103 from the top. In FIG. 4 and FIG. 5, the vertical direction indicates signal voltage and the horizontal direction indicates time.

Firstly, an operation when the reduction of a power supply voltage and an increase in a ground voltage do not occur in the latch circuits D_0 to D_7 will be described with reference to FIG. 4.

At a timing according to the comparison start of the comparison unit 11, a clock of a cycle approximately coinciding with a delay time (the sum of delay times of the eight delay units DU[0] to DU[7]) of the delay unit 15 is input to the delay unit 15 as the start pulse Start_P. In this way, the delay unit 15 starts to operate. The delay unit DU[0] constituting the delay unit 15 delays the start pulse Start_P and outputs the output signal CK0, and the delay units DU[1] to DU[7] constituting the delay unit 15 delay the output of delay units of a previous stage and output the output signals CK1 to CK7. The output signals CK0 to CK7 of the delay units DU[0] to DU[7] are input to the latch circuits D_0 to D_7 of the latch unit 101. At this time, since the output signal CO of the comparison unit 11 is in the Low state, the output signal xCO_D of the inversion delay circuit DLY is in the High state, and the output signal Hold_L of the AND circuit AND1 of the signal generation unit 12 is in the Low state, the output signal Hold_L of the AND circuit AND of the signal generation unit 12 changes to the Low state and the latch circuits D_0 to D_6 are in the disable state, so that the A/D conversion circuit stops operating.

Meanwhile, since the output signal xCO_D of the inversion delay circuit DLY is in the High state and the control signal Enable1 is in the High state, the output signal Hold_C of the AND circuit AND2 of the latch unit 101 changes to the High state. Furthermore, since the control signal Enable2 is in the High state, the latch circuit D_7 changes to the enable state and outputs the input output signal CK7 of the delay unit DU[7] to the counter 14 as is.

The counter 14 performs a counting operation based on the output signal CK7 of the delay unit DU[7], which is output from the latch circuit D_7 of the latch unit 101. In the counting operation, a count value increases or decreases with the rise or the fall of the output signal CK7.

After the start pulse Start_P is input to the delay unit 15 and the delay unit 15 starts to operate, while a signal voltage corresponding to the ramp wave Ramp is larger than a signal voltage corresponding to the analog signal Sig, the output signal CO of the comparison unit 11 is in the Low state. When the signal voltage corresponding to the ramp wave Ramp is equal to or less than the signal voltage corresponding to the analog signal Sig, the output signal CO of the comparison unit 11 changes to the High state (a first timing). A period until the output signal CO of the comparison unit 11 changes to the High state from the time point according to the start of a comparison process of the comparison unit 11 is a time interval that is an object of detection. The number of start pulses Start_P passing through the delay units DU[0] to DU[7] constituting the delay unit within the period is a number corresponding to the level of the analog signal Sig.

After the passage of the time interval that is an object of detection, the output signal CO of the comparison unit 11 is inverted, so that the output signal Hold_L of the AND circuit AND1 of the signal generation unit 12 changes to the High state. In this way, the latch circuits D_0 to D_6 change to the enable state. After the lapse of a time coinciding with the delay time tDLY1 of the inversion delay circuit DLY of the signal generation unit 12 from the first timing (at a second timing), since the output signal xCO_D of the inversion delay circuit DLY of the signal generation unit 12 is inverted, the output signal Hold_L of the AND circuit AND1 of the signal generation unit 12 changes to the Low state. In this way, the latch circuits D_0 to D_6 change to the disable state. At this time, the logic states corresponding to the output signals CK0 to CK6 of the delay units DU[0] to DU[6] are latched by the latch circuits D_0 to D_6. Furthermore, since the output signal Hold_C of the AND circuit AND2 of the latch unit 101 changes to the Low state at the second timing, the latch circuit D_7 changes to the disable state and the logic state corresponding to the output signal CK7 of the delay unit DU[7] is latched by the latch circuit D_7.

At this time, since voltage drop of the power supply voltage and an increase in the ground voltage do not occur in the latch circuits D_0 to D_6, it is assumed that the latch circuits D_0 to D_6 operate for the delay time tDLY1 of the inversion delay circuit DLY and accurately latch input signals. A latch result of the latch circuit D_7 is $(11100001)_2=$(D_7=1, D_6=1, D_5=1, D_4=0, D_3=0, D_2=0, D_1=0, and D_0=1) ("0" corresponds to the Low state and "1" corresponds to the High state).

The counter 14 latches a count value when the latch circuit D_7 latches the output signal CK7. Then, the control signal Enable2 changes to the Low state from the High state. In this way, the latch circuit D_7 changes to the disable state.

Subsequently, the control signals SW7 to SW0 sequentially change to the High state from the Low state, so that the switching circuits SW_7 to SW_0 are sequentially turned ON and the signals latched in the latch circuits D_7 to D_0 are sequentially read to a circuit of a rear stage. The signals read from the latch circuits D_7 to D_0, for example, are input to an operation unit (not illustrated) of a rear stage and are subject to a binarization process. Based on a result obtained by binarizing the logic states of the signals latched in the latch unit 101 and the count value latched in the counter 14, data of an AD conversion result corresponding to the time interval is obtained.

Furthermore, the switching circuits SW_7 to SW_0 are sequentially turned ON, so that the input terminal IN of the determination unit 102 is sequentially connected to the latch circuits D_7 to D_0 and the signals latched in the latch circuits D_7 to D_0 are sequentially input to the determination unit 102. The control signal Sig_RST that is input to the input terminal RST of the determination unit 102 is in the High state.

While the input signal of the input terminal IN is switched from the output signal of the latch circuit D_1 to the output signal of the latch circuit D_0, the edge detection circuit EDG1 of the determination unit 102 detects a rising edge at which an input signal is switched from the Low state (the logic value "0") to the High state (the logic value "1"). When the edge detection circuit EDG1 of the determination unit 102 detects the rising edge, the output signal of the output terminal Q0 of the latch circuit DFF_0 changes to the High state from the Low state and the output signal of the output terminal XQ0 of the latch circuit DFF_0 changes to the Low state from the High state, so that the output signal Jout in the Low state is input to the delay controller 103. When the output signal Jout of the determination unit 102 is in the Low state, since the latch circuits D_0 to D_7 accurately latch the output signals CK0 to CK7 of the delay units DU[0] to DU[7], the control signal DLY_SEL of the delay controller 103 is in the Low state and the delay time of the inversion delay circuit DLY is tDLY1.

Next, an operation when the reduction of the power supply voltage and an increase in the ground voltage has occurred in the latch circuits D_0 to D_7 will be described with reference to FIG. 5. In the present operation, since an operation until the latch circuits D_0 to D_7 latch the output signals CK0 to CK7 of the delay units DU[0] to DU[7] is the same as the aforementioned operation, a description thereof will be omitted here.

After the latch circuits D_0 to D_6 change to the enable state at the first timing at which the output signal Hold_L of the signal generation unit 12 has changed from the Low state to the High state, the output signal xCO_D of the inversion delay circuit DLY of the signal generation unit 12 is inverted and changes to the Low state and the output signal Hold_L of the AND circuit AND1 of the signal generation unit 12 and the output signal Hold_C of the AND circuit AND2 of the latch unit 101 change to the Low state at the second timing at which the time coinciding with the delay time tDLY1 of the inversion delay circuit DLY has lapsed. In this way, the logic states corresponding to the output signals CK0 to CK7 of the delay units DU[0] to DU[7] are latched by the latch circuits D_0 to D_7. At this time, due to the reduction of the power supply voltage and an increase in the ground voltage occurring in the latch circuits D_0 to D_7 as described above, it is assumed that the operations of the latch circuits D_0 to D_7 are delayed and the latch circuits D_0 to D_7 latch incorrect logic states. According to a detailed example, it is assumed that the latch circuit D_6 does not operate within the delay time tDLY1 of the inversion delay circuit DLY, does not accurately latch the logic state "1," and latches the logic state "0," so that the logic states in the signals latched in the latch circuits D_0 to D_7 are $(10100001)_2=$(D_7=1, D_6=0, D_5=1, D_4=0, D_3=0, D_2=0, D_1=0, and D_0=1) ("0" corresponds to the Low state and "1" corresponds to the High state).

The counter 14 latches a count value when the latch circuit D_7 latches the output signal CK7. Subsequently, the switching circuits SW_7 to SW_0 are sequentially turned ON, so that the input terminal IN of the determination unit 102 is sequentially connected to the latch circuits D_7 to D_0 and the signals latched in the latch circuits D_7 to D_0 are sequentially input to the determination unit 102. The control signal Sig_RST that is input to the input terminal RST of the determination unit 102 is in the High state.

While the input signal of the input terminal IN is switched from the output signal of the latch circuit D_6 to the output signal of the latch circuit D_5 and is switched from the output signal of the latch circuit D_1 to the output signal of the latch circuit D_0, the edge detection circuit EDG1 of the determination unit 102 detects a rising edge two times, at which an input signal is switched from the Low state (the logic value "0") to the High state (the logic value "1"). When the edge detection circuit EDG1 of the determination unit 102 detects the rising edge between the output signal of the latch circuit D_6 and the output signal of the latch circuit D_5, the output signal of the output terminal Q0 of the latch circuit DFF_0 changes from the Low state to the High state and the output signal of the output terminal XQ0 of the latch circuit DFF_0 changes from the High state to the Low state.

Subsequently, when the edge detection circuit EDG1 of the determination unit 102 detects the rising edge between the output signal of the latch circuit D_1 and the output signal of the latch circuit D_0, the output signal of the output terminal Q0 of the latch circuit DFF_0 changes from the High state to the Low state and the output signal of the output terminal XQ0 of the latch circuit DFF_0 changes from the Low state to the High state, so that the output signal Jout in the High state is input to the delay controller 103.

When the output signal Jout of the determination unit 102 is in the High state, since the latch circuits D_0 to D_7 do not accurately latch the output signals CK0 to CK7 of the delay units DU[0] to DU[7], the control signal DLY_SEL of the delay controller 103 changes to the High state and the delay time of the inversion delay circuit DLY is tDLY2. In this way, in the following AD conversion operation, the output signal Hold_L of the signal generation unit 12 changes to the High state, the latch circuits D_0 to D_6 change to the enable state, and then the output signal xCO_D of the inversion delay circuit DLY of the signal generation unit 12 changes to the Low state. Subsequently, since the period (the delay time of the inversion delay circuit DLY) until the latch circuits D_0 to D_7 latch the output signals CK0 to CK7 of the delay units DU[0] to DU[7] latch becomes long, even when the operations of the latch circuits D_0 to D_7 are delayed due to the reduction of the power supply voltage and an increase in the ground voltage occurring in the latch circuits D_0 to D_7, the latch circuits D_0 to D_6 operate within the delay time of the inversion delay circuit DLY and accurately latch the output signals CK0 to CK6 of the delay units DU[0] to DU[6].

According to the aforementioned configuration, it is determined whether the latch circuits D_0 to D_7 accurately latch the output signals CK0 to CK7 of the delay units DU[0] to DU[7], and the delay time of the inversion delay circuit DLY is set to be long when the latch circuits D_0 to D_7 do not accurately latch the output signals CK0 to CK7. In this way, the latch circuits D_0 to D_7 change to the enable state within the delay time of the inversion delay circuit DLY. Thus, the latch circuits D_0 to D_7 accurately latch the output signals CK0 to CK7 of the delay units DU[0] to DU[7], so that it is possible to minimize an increase in current consumption related to the AD conversion operation and to prevent the degree of accuracy of the AD conversion from being reduced.

The latch circuit D_7 is controlled to change to the enable state at the timing according to the comparison start of the comparison unit 11, and a time until the output signal CK7 of the delay unit DU[7] is latched after transition to the enable state starts is longer than that in the case of the latch circuits D_0 to D_6 . Thus, the probability of the latch circuit D_7 latching an incorrect logic state is lower than the probability of the latch circuits D_0 to D_6 latching incorrect logic states.

Consequently, the determination unit 102 may not perform determination for a signal latched by the latch circuit D_7. When the latch circuit D_7 is controlled to start the transition to the enable state at a timing prior to the first timing and near the first timing, the determination unit 102 may perform determination for the signal latched by the latch circuit D_7 such that the latch circuit D_7 does not latch an incorrect logic state.

The configuration of the determination unit 102 of the present embodiment is the same as the configuration illustrated in FIG. 3. However, the present invention is not limited thereto. It is sufficient to employ a configuration in which it is possible to determine whether the latch circuits D_0 to D_7 accurately latch the output signals CK0 to CK7 of the delay units DU[0] to DU[7] and to output a determination result to the delay controller 103.

Furthermore, it is sufficient if the number of delay units and the number of latch circuits are two or more. When the number of latch circuits is set to n (n≥2) and the latch circuits D_0, D_1, . . . , D_n are arranged, the latch circuits D_0 to D_(n-k) (1≤k≤n-1) are controlled to change to the enable state from the first timing to the second timing similarly to the latch circuits D_0 to D_6, and the latch circuits D_(n-k+1) to D_n are controlled to change to the enable state from at least a comparison start timing to the second timing similarly to the latch circuit D_7.

Second Embodiment

Figure 6:
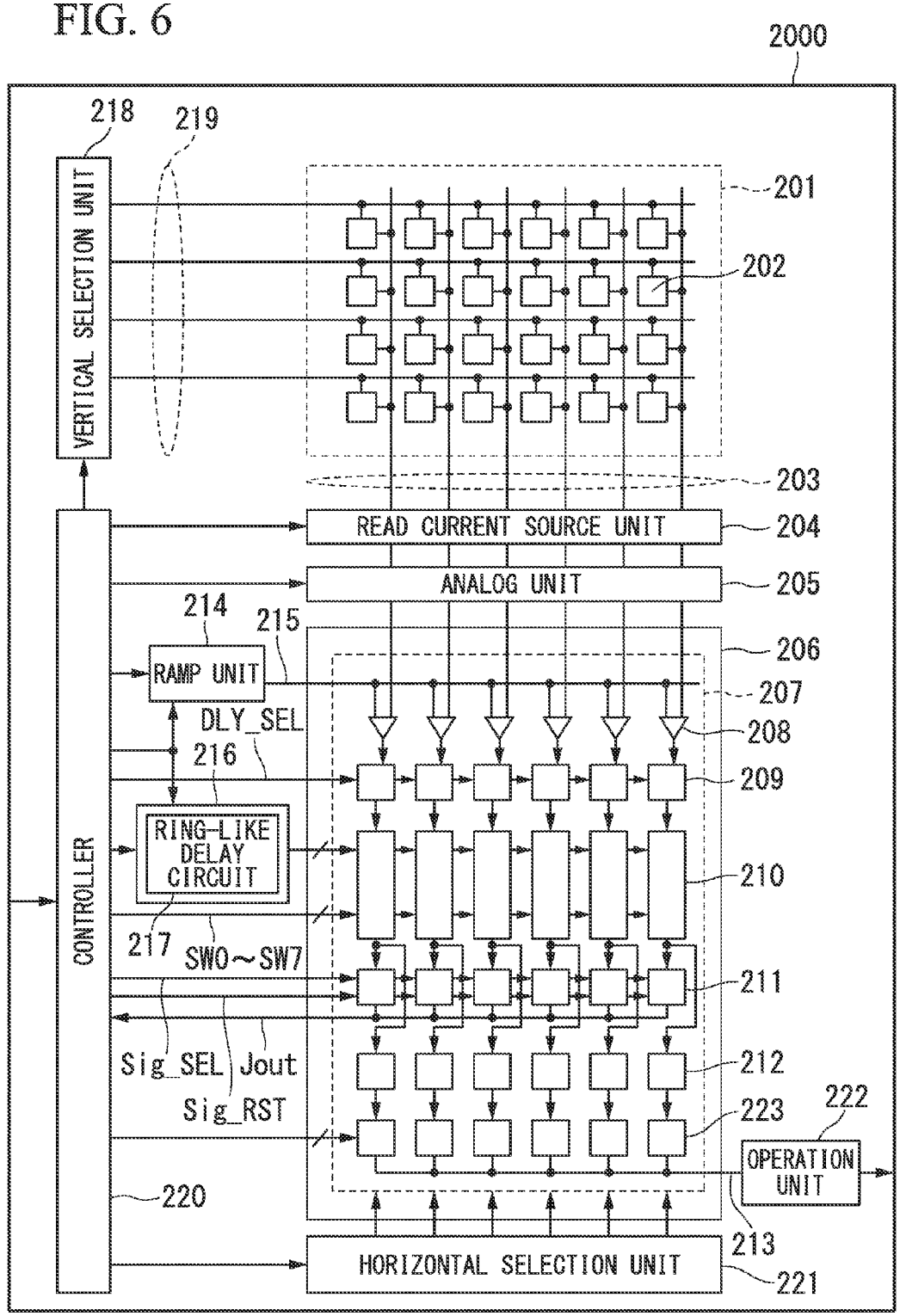
FIG. 6 is a block diagram illustrating the configuration of a solid-state imaging device according to a second embodiment of the present invention.

Next, a second embodiment of the present invention will be described. FIG. 6 illustrates an example of the configuration of a solid-state imaging device according to the present embodiment. Hereinafter, the configuration of the present embodiment will be described. A solid-state imaging device 2000 illustrated in FIG. 6 includes an imaging unit 201, a read current source unit 204, an analog unit 205, a column processing unit 206, an operation unit 222, a ramp unit 214, a delay unit 216, a vertical selection unit 218, a controller 220, and a horizontal selection unit 221.

The imaging unit 201 includes a plurality of unit pixels 202 that are arranged in a matrix form to generate and output a signal corresponding to the amount of incident light. The vertical selection unit 218 selects each row of the imaging unit 201. The read current source unit 204 reads a signal from the imaging unit 201 as a voltage signal. The analog unit 205 includes a sample and hold circuit and the like, performs analog processing on a signal read from the imaging unit 201, and outputs a processed signal.

The delay unit 216 corresponds to the delay unit 15 described in the first embodiment, and includes a ring-like delay circuit 217. The ramp unit 214 generates a ramp wave, which increases or decreases with the lapse of time, as a reference signal. The column processing unit 206 is connected to the ramp unit 214 through a reference signal line 215. The horizontal selection unit 221 reads data generated by the column processing unit 206 to a horizontal signal line 213. The operation unit 222 is connected to the horizontal signal line 213. The controller 220 controls each element and has the functions of the delay controller 103 of the first embodiment.

In FIG. 6, the case in which the imaging unit 2 includes unit pixels 202 of 4 rows×6 columns will be described for simplicity. However, several tens to several tens of thousands of unit pixels 202 are actually arranged in each row and each column of the imaging unit 201. Although not illustrated in the drawing, each unit pixel 202 constituting the imaging unit 201 includes a photoelectric conversion element such as a photodiode, a photogate, or a phototransistor, and a transistor circuit.

In this system configuration, a peripheral driving system or a signal processing system, which controls the driving of each unit pixel 202 of the imaging unit 201, that is, peripheral circuits of the vertical selection unit 218, the horizontal selection unit 221, the column processing unit 206, the operation unit 222, the delay unit 216, the ramp unit 214, the controller 220 and the like, may be integrally formed with a semiconductor region, such as single crystal silicon, using the same technology as a semiconductor integrated circuit fabrication technology, together with the imaging unit 201.

Hereinafter, each of the elements will be described in detail. Each one end of row control lines 219 corresponds to a row of the vertical selection unit 218, and in the imaging unit 201, the unit pixels 202 of 4 rows×6 columns are arranged in a two-dimensional manner, and the row control line 219 is provided for each row with respect to the pixel arrangement of 4 rows×6 columns. The vertical selection unit 218 includes a shift register, a decoder and the like, and controls row addresses and row scanning of the imaging unit 201 through the row control lines 219 when each unit pixel 202 of the imaging unit 201 is driven.

Furthermore, a vertical signal line 203 is provided for each column with respect to the pixel arrangement of the imaging unit 201.

The read current source unit 204, for example, includes NMOS transistors. The vertical signal line 203 from the imaging unit 201 is connected to a drain terminal, an appropriate desired voltage is applied to a control terminal, and a source terminal is connected to a ground voltage GND. In this way, a signal from the unit pixel 202 is output as a voltage mode. Although the case in which the NMOS transistor is used as a current source has been described, the present invention is not limited thereto.

A detailed description of the analog unit 205 will be omitted here. However, the analog unit 205 performs a process such as sample & hold on an analog signal output from the imaging unit 201 with respect to a pixel signal of the voltage mode input through the vertical signal line 203. A PGA (=Programmable Gain Amplifier) circuit and the like, which have a signal amplification function, may also be provided according to necessity.

The column processing unit 206, for example, has an ADC unit 207 provided for each pixel array of the imaging unit 201, that is, each vertical signal line 203, and converts an analog pixel signal, which is read from each unit pixel 202 of the imaging unit 201 through the vertical signal line 203 every pixel array, into digital data. The present embodiment employs a configuration in which the ADC units 207 are arranged for the pixel arrays of the imaging unit 201 in a one-to-one fashion. However, this is for illustrative purposes only and the present invention is not limited to this arrangement relation. For example, it may be possible to employ a configuration in which one ADC unit 207 is arranged for a plurality of pixel arrays, and is used among the plurality of pixel arrays in a time division manner. The column processing unit 206 constitutes an AD conversion circuit, which converts an analog pixel signal read from the unit pixel 202 of a selected pixel row of the imaging unit 201 into digital pixel data together with the ramp unit 214, the delay unit 216 and the operation unit 222, which will be described later.

The delay unit 216 includes the ring-like delay circuit 217 configured by a VCO (Voltage Controlled Oscillator) that is a symmetrical oscillation circuit. The ring-like delay circuit 217 includes the delay units DU[0] to DU[7] as illustrated in FIG. 2. However, the delay unit 216 is not limited thereto. Similarly to the symmetric oscillation circuit, the ring-like delay circuit itself includes an odd number of delay units, but the output thereof may use an even number (specifically, a power of 2) of so-called asymmetric oscillation circuits. Moreover, the ring-like delay circuit itself may use a delay circuit including an even number (particularly, a power of 2) of delay units, in which the output (terminals) of a lower logic state is an even number (specifically, a power of 2), or the ring-like delay circuit itself may also use a full differential type inversion circuit including an even number (particularly, a power of 2) of delay units, in which the output of final terminals of full differential type inversion circuits constituting the delay units is fed back to an opposite side of the input of initial terminals thereof. As the delay unit 216, the ring-like delay circuit is preferable. However, the present invention is not limited thereto.

The ramp unit 214, for example, includes an integration circuit, generates a so-called ramp wave, which has a level that becomes inclined with the lapse of time, and supplies the ramp wave to one of input terminals of the comparison unit 208 through the reference signal line 215 under the control of the controller 220. Furthermore, the ramp unit 214 is not limited to a unit using the integration circuit. For example, the ramp unit 214 may use a DAC circuit. However, in the case of employing a configuration in which the ramp wave is generated using the DAC circuit in a digital manner, it is necessary to allow steps of the ramp wave to be fine, or to employ a configuration equivalent thereto.

The horizontal selection unit 221 includes a shift register, a decoder and the like, and controls column address and column scanning of the ADC unit 207 of the column processing unit 206. Under the control of the horizontal selection unit 221, the AD converted digital data in the ADC unit 207 of each column is sequentially read to the horizontal signal line 213, and the output signals Jout of determination units 211 of each column are simultaneously output sequentially to the controller 220.

The operation unit 222 performs coding conversion such as binarization based on the digital data that is output to the horizontal signal line 213, and outputs binarized digital data. Furthermore, the operation unit 222, for example, may have a signal processing function including black level adjustment, column variation correction, color processing and the like. Moreover, the operation unit 222 may convert n-bit parallel digital data to serial data and output the serial data.

The controller 220 has a functional block of a TG (Timing Generator) that supplies a clock or a pulse signal of a predetermined timing, which is required for the operations of the ramp unit 214, the delay unit 216, the vertical selection unit 218, the horizontal selection unit 221, the column processing unit 206, the operation unit 222 and the like, and a functional block for communicating with the TG. The controller 220 also has a function as the delay controller 103 described in the first embodiment, and outputs a control signal DLY_SEL used to control delay times of latch control units 209 of the column processing unit 206 to the latch control units 209. Furthermore, the controller 220 outputs control signals SW0 to SW7 used to control the operation of latch units 210 of the column processing unit 206 to the latch units 210, and outputs control signals Sig_SEL and Sig_RST used to control the operation of the determination units 211 of the column processing unit 206 to the determination units 211, which will be described in detail later.

The controller 220 may be provided as a separate semiconductor integrated circuit, independent of other functional elements of the imaging unit 201, the vertical selection unit 218, the horizontal selection unit 221 and the like. In this case, an imaging device, which is an example of a semiconductor system, is constructed of an imaging device including the imaging unit 201, the vertical selection unit 218, the horizontal selection unit 221 and the like, and the controller 220. This imaging device may be provided as an imaging module having peripheral signal processing circuits, a power source circuit and the like.

Next, the configuration of the ADC unit 207 will be described. Each ADC unit 207 compares the analog pixel signal, which is read from each unit pixel 202 of the imaging unit 201 through the vertical signal line 203, with the ramp wave that is applied from the ramp unit 214 and is used for AD conversion, thereby generating a time interval having a size (a pulse width) in the time axis direction corresponding to a size of the pixel signal. Then, the ADC unit 207 performs AD conversion using data corresponding to the time interval as digital data corresponding to the size of the pixel signal.

Hereinafter, details of the configuration of the ADC unit 207 will be described. The ADC unit 207 is provided for each column, and in FIG. 6, six ADC units 207 are provided. The ADC units 207 provided for the columns have the same configuration. Each ADC unit 207 includes the comparison units 208, the latch control units 209, the latch units 210, the determination units 211, column counter units 212, and memory units 223.

The comparison unit 208 corresponds to the comparison unit 11 described in the first embodiment. The comparison unit 208 compares the analog pixel signal, which is output from the unit pixel 202 of the imaging unit 201 through the vertical signal line 203, with the signal voltage of the ramp wave that is supplied from the ramp unit 214. In this way, the size of the pixel signal is converted into a time interval (a pulse width) that is information in the time axis direction. The comparison output (an output signal CO) of the comparison unit 208, for example, changes to the Low level when a ramp voltage is larger than a signal voltage, and changes to the High level when the ramp voltage is equal to or less than the signal voltage.

The latch control unit 209 corresponds to the signal generation unit 12 described in the first embodiment. The latch control unit 209 includes a delay circuit DLY and an AND circuit AND1 similarly to the signal generation unit 12. The latch control unit 209 generates a control signal used to control the latch unit 210 and the column counter unit 212 based on the comparison output of the comparison unit 208.

The latch unit 210 corresponds to the latch unit 101 described in the first embodiment. The latch unit 210 includes latch circuits D_0 to D_7 and an AND circuit AND2 similarly to the latch unit 101. At a timing (a first timing) at which the output signal CO of the comparison unit 208 is inverted, the latch circuits D_0 to D_6 constituting the latch unit 210 change to the enable state. After a predetermined time lapses from the first timing (at a second timing), the latch circuits D_0 to D_7 of the latch unit 210 latch (hold/store) the logic states of the output signals CK0 to CK7 of the delay units DU[0] to DU[7]. The latch circuits D_0 to D_7 latch the logic states of the output signals CK0 to CK7 of the delay units DU[0] to DU[7], so that data (lower data) of lower bits, which constitutes digital data, is obtained.

The determination unit 211 corresponds to the determination unit 102 described in the first embodiment. The determination unit 211 determines the logic states of the signals latched in the latch circuits D_0 to D_7 of the latch unit 210. In this way, the determination unit 211 determines whether the latch circuits D_0 to D_7 accurately latch the output signals CK0 to CK7 of the delay units DU[0] to DU[7], and outputs a signal (a determination signal) indicating a determination result to the controller 220.

The column counter 212 corresponds to the counter 14 described in the first embodiment. The column counter 212 performs counting based on an output signal (corresponding to the output signal CK7 of the delay unit DU[7]) of the latch circuit D_7 of the latch unit 210. Furthermore, as the column counter 212, a counter circuit having a latch function of holding the logic state of the column counter 212 is considered. The column counter 212 performs counting, so that data (upper data) of upper bits, which constitutes digital data, is obtained. The memory unit 223 holds the logic states of the latch unit 210 and the column counter 212 under the control of the controller 220.

Furthermore, lower data signals, which correspond to the logic states of the output signals CK0 to CK7 of the delay units DU[0] to DU[7] latched in the latch unit 210, for example, are data of 8 bits. Furthermore, upper data signals constituting the count value of the column counter 212, for example, are data of 10 bits.

10 bits are an example, and a bit number (for example, 8 bits) smaller than 10 bits or a bit number (for example, 12 bits) exceeding 10 bits may be employed.

Figure 7:
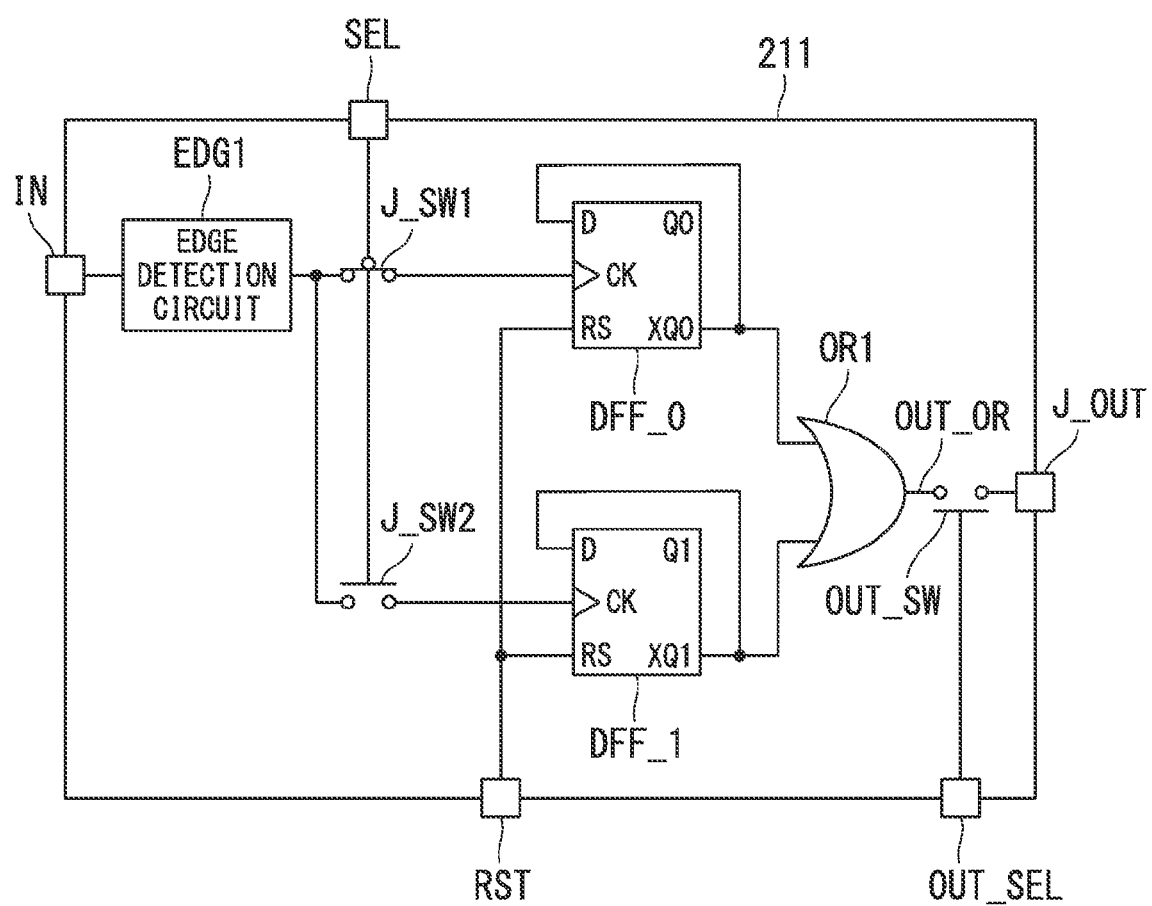
FIG. 7 is a block diagram illustrating the configuration of a determination unit provided in a solid-state imaging device according to a second embodiment of the present invention.

FIG. 7 illustrates an example of the configuration of the determination unit 211. The determination unit 211 includes an edge detection circuit EDG1, switching circuits J_SW1 and J_SW2, latch circuits DFF_0 and DFF_, an OR circuit OR1, and a switching circuit OUT_SW. An input terminal of the edge detection circuit EDG1 is connected to an input terminal IN.

The edge detection circuit EDG1 detects switching from the Low state to the High state (or switching from the High state to the Low state) of the input signal of the input terminal IN, and outputs a result of the detection to the switching circuits J_SW1 and J_SW2.

One end of the switching circuit J_SW1 is connected to an output terminal of the edge detection circuit EDG1 and one end of the switching circuit J_SW2. The other end of the switching circuit J_SW1 is connected to an input terminal CK of the latch circuit DFF_0. An inversion input terminal XQ0 of the latch circuit DFF_0 is connected to an input terminal D of the latch circuit DFF_0 and one end of the OR circuit OR1.

One end of the switching circuit J_SW2 is connected to the output terminal of the edge detection circuit EDG1 and one end of the switching circuit J_SW1. The other end of the switching circuit J_SW2 is connected to the input terminal CK of the latch circuit DFF_1. An inversion input terminal XQ1 of the latch circuit DFF_1 is connected to an input terminal D of the latch circuit DFF_1 and one end of the OR circuit OR1.

The switching circuits J_SW$_1$ and J_SW2 are controlled by an input signal of an input terminal SEL. The control signal Sig_SEL from the controller 220 is input to the input terminal SEL. The switching circuit J_SW1 is turned ON when the input signal of the input terminal SEL is in the Low state, and is turned OFF when the input signal of the input terminal SEL is in the High state. The switching circuit J_SW2 is turned ON when the input signal of the input terminal SEL is in the High state, and is turned OFF when the input signal of the input terminal SEL is in the Low state.

In the present embodiment, since AD conversion including AD conversion to a reset level and AD conversion to a signal level is performed twice, the two latch circuits DFF_0 and DFF_1 corresponding to the two types of AD conversion are provided.

An input terminal RS of the latch circuit DFF_0 is connected to an input terminal RST. The control signal Sig_RST from the controller 220 is input to the input terminal RST.

When the input signal of the input terminal RST is in the Low state, since the output signal of the output terminal Q0 of the latch circuit DFF_0 changes to the Low state and the output signal of the output terminal XQ0 thereof changes to the High state regardless of the logic state of the input signal of the input terminal D of the latch circuit DFF_0, the latch circuit DFF_0 changes to the disable state. When the input signal of the input terminal RST is in the High state, since the output signal of the output terminal Q0 changes to the Low state or the High state and the output signal of the output terminal XQ0 thereof changes to the High state or the Low state according to the logic states of the input signals of the input terminals CK and D of the latch circuit DFF_0, the latch circuit DFF_0 changes to the enable state. When the input signal of the input terminal CK changes to the High state from the Low state, the latch circuit DFF_0 outputs a signal in the same logic state as the input signal of the input terminal D from the output terminal Q0, and outputs a signal in a logic state obtained by inverting the logic state of the input signal of the input terminal D from the output terminal XQ0.

An input terminal RS of the latch circuit DFF_1 is connected to the input terminal RST. When the input signal of the input terminal RST is in the Low state, since the output signal of the output terminal Q1 of the latch circuit DFF_1 changes to the Low state and the output signal of the output terminal XQ1 thereof changes to the High state regardless of the logic state of the input signal of the input terminal D of the latch circuit DFF_1, the latch circuit DFF_1 changes to the disable state. When the input signal of the input terminal RST is in the High state, since the output signal of the output terminal Q1 changes to the Low state or the High state and the output signal of the output terminal XQ1 thereof changes to the High state or the Low state according to the logic states of the input signals of the input terminals CK and D of the latch circuit DFF_1, the latch circuit DFF_1 changes to the enable state. When the input signal of the input terminal CK enters the High state from the Low state, the latch circuit DFF_1 outputs a signal the same logic state as the input signal of the input terminal D from the output terminal Q1, and outputs a signal in a logic state obtained by inverting the logic state of the input signal of the input terminal D from the output terminal XQ1.

An output terminal of the OR circuit OR1 is connected to one end of the switching circuit OUT_SW. The other end of the switching circuit OUT_SW is connected to an output terminal J_OUT. An output signal OUT_OR of the OR circuit OR1 is output from the output terminal J_OUT through the switching circuit OUT_SW as an output signal Jout. The determination unit 211 outputs an output signal Jout in the Low state when the latch circuits D_0 to D_7 accurately latch the output signals CK0 to CK7 of the delay units DU[0] to DU[7], and outputs an output signal Jout in the High state when the latch circuits D_0 to D_7 do not accurately latch the output signals CK0 to CK7 of the delay units DU[0] to DU[7], which will be described later. The switching circuit OUT_SW is controlled by a signal from the horizontal selection unit 221.

Next, an operation of the present embodiment will be described. Hereinafter, a description of a detailed operation of the unit pixel 202 will be omitted, but the unit pixel 202 outputs a reset level and a signal level as is well known in the art.

AD conversion is performed as follows. For example, a ramp wave dropping with a predetermined slope is compared with a signal voltage of a reset level or a signal level, which is a pixel signal from the unit pixel 202. For a period until a predetermined time lapses (a second timing) from a time point (a first timing) at which a voltage of a signal corresponding to the reset level or the signal level coincides with a voltage (a ramp voltage) of the ramp wave, after generation of the ramp wave used in the comparison process, measurement is performed using a count value based on, for example, the output signal CK7 (corresponding to the output signal of the latch circuit D_7 of the latch unit 101 illustrated in FIG. 1) of the delay units DU[0] to DU[7], and a logic state of multi-phase clocks (the output signals CK0 to CK7, that is, corresponding to the output signals of the latch circuits D_0 to D_7 of the latch unit 101 illustrated in FIG. 1) having a fixed phase difference. In this way, digital data corresponding to the reset level or the signal level is obtained.

Furthermore, from each unit pixel 202 of a selection row of the imaging unit 201, a reset level including noise of a pixel signal is read as an analog pixel signal through a first read operation, and then a signal level is read through a second read operation. Then, the reset level and the signal level are input to the ADC unit 207 through the vertical signal line 203 in time series. The signal level may be read through the first read operation and then the reset level may be read through the second read operation.

FIG. 8, FIG. 9, FIG. 10, and FIG. 11 illustrate an A/D conversion operation according to the present embodiment. FIG. 8, FIG. 9, FIG. 10, and FIG. 11 illustrate waveforms of the ramp wave Ramp, the analog signal Sig, the start pulse Start_P, the output signals CK0 to CK7 of the delay units DU[0] to DU[7], the control signals SW0 to SW7 used to control the switching circuits SW_0 to SW_7, the output signal CO of the comparison unit 208, the output signal xCO_D of the inversion delay circuit DLY, the output signal Hold_L of the AND circuit AND1, the control signals Enable1 and Enable2, the output signal Hold_C of the AND circuit AND2, the control signal Sig_SEL, the output signals of the output terminals Q0 and XQ0 of the latch circuit DFF_0, the output signals of the output terminals Q1 and XQ1 of the latch circuit DFF_1, the output signal OUT_OR of the OR circuit OR1, the output signal Jout of the determination unit 211, and the control signal DLY_SEL. In FIG. 8, FIG. 9, FIG. 10, and FIG. 11, the vertical direction indicates signal voltage and the horizontal direction indicates time.

Figure 8:
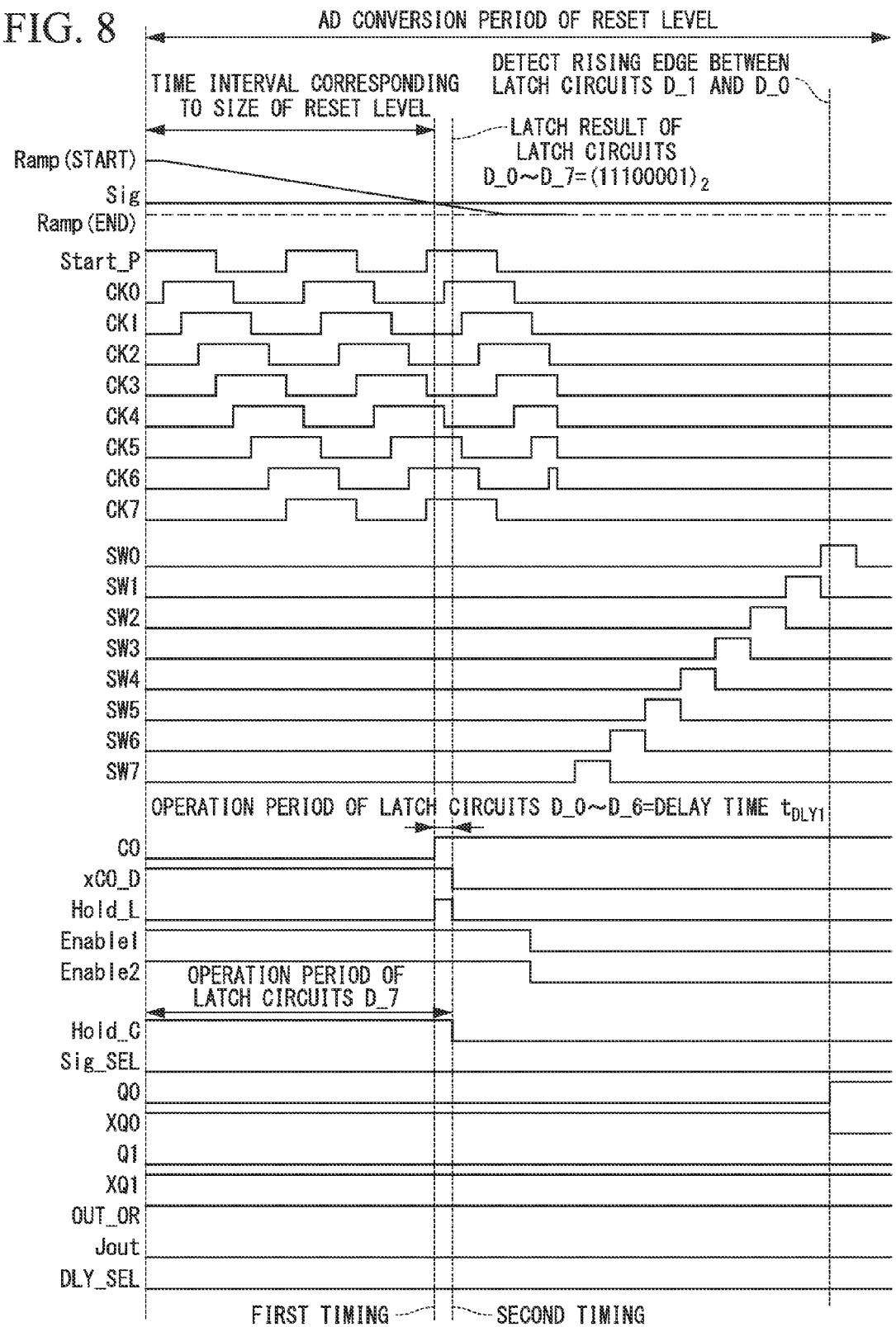
FIG. 8 is a timing chart illustrating the A/D conversion operation of a solid-state imaging device according to a second embodiment of the present invention.
Figure 9:
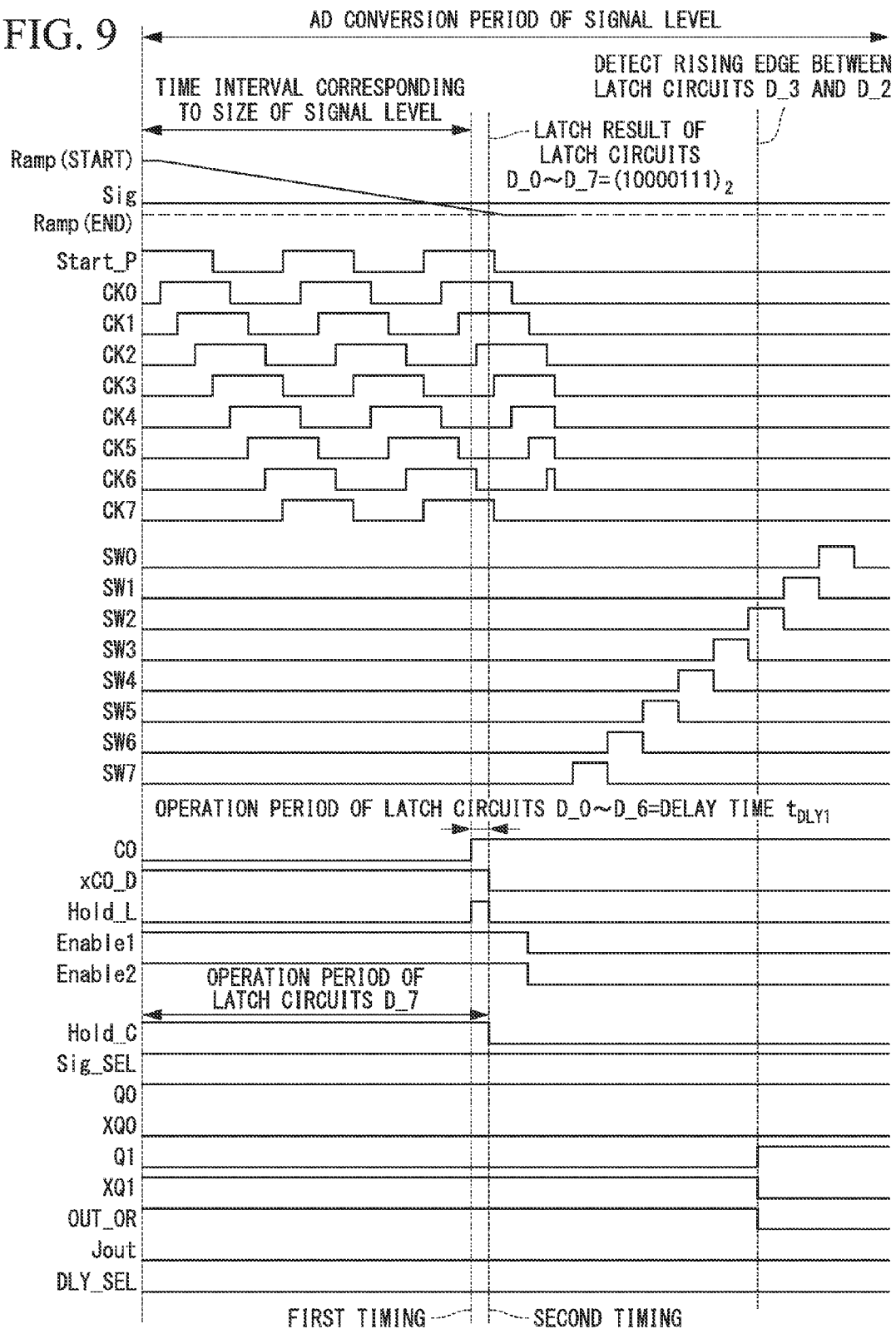
FIG. 9 is a timing chart illustrating the A/D conversion operation of a solid-state imaging device according to a second embodiment of the present invention.

Firstly, an operation when the reduction of the power supply voltage and an increase in the ground voltage do not occur in the latch circuits D_0 to D_7 will be described with reference to FIG. 8 and FIG. 9.

<First Reading: FIG. 8>

After first reading from the unit pixel 202 of an arbitrary pixel row to the vertical signal line 203 is stabilized, the controller 220 supplies the ramp unit 214 with control data used to generate ramp wave. At this time, it is assumed that the output signal Jout of the determination unit 211 changes to the Low state. The ramp unit 214 outputs a ramp wave, which has a waveform temporally varying in a ramp shape as a whole, as a comparison voltage to be applied to the input terminal of the comparison unit 208. The comparison unit 208 starts to compare the ramp wave with a reset level. Furthermore, at this time, the controller 220 changes a start pulse, which is output to the ring-like delay circuit 217, from the Low state to the High state.

The comparison unit 208 compares the ramp wave applied from the ramp unit 214 with the reset level, and inverts the output signal CO when voltages of the ramp wave and the reset level approximately coincide (a first timing). The output signal CO is further inverted and delayed in the latch control unit 209 to be output (a second timing). At the first timing, based on the output signal CO of the comparison unit 208, the latch circuits D_0 to D_6 of the latch unit 210 change to the enable state. Furthermore, at the second timing, the output signal Hold_L of the latch control unit 209 and the output signal Hold_C of the AND circuit AND2 of the latch unit 210 are changed from the High state to the Low state, so that the latch circuits D_0 to D_7 of the latch unit 210 latch logic states corresponding to the output signals CK0 to CK7 of the delay units DU[0] to DU[7] as a first lower data signal. At this time, since the reduction of the power supply voltage and an increase in the ground voltage do not occur in the latch circuits D_0 to D_7, it is assumed that the latch circuits D_0 to D_6 operate for the delay time $t_{DLY1}$ of the inversion delay circuit DLY and accurately latch input signals. The logic states of the signals latched in the latch circuits D_0 to D_7 are $(11100001)_2$=(D_7=1, D_6=1, D_5=1, D_4=0, D_3=0, D_2=0, D_1=0, and D_0=1) ("0" corresponds to the Low state and "1" corresponds to the High state).

The column counter 212 latches a count value as a first upper data signal when the latch circuit D_7 of the latch unit 210 latches the output signal CK7. When a predetermined time lapses, the controller 220 controls to change the latch circuit D_7 to be in the disable state, and to stop the supply of the control data to the ramp unit 214 and the output from the delay unit 216. In this way, the ramp unit 214 stops the generation of the ramp wave.

Subsequently, the control signals SW7 to SW0 sequentially change from the Low state to the High state, so that the first lower data signal is transmitted to the memory unit 223. At this time, since the control signal Sig_SEL is in the Low state, the switch circuit J_SW1 of the determination unit 211 changes to an ON state and the switch circuit J_SW2 changes to an OFF state, so that the edge detection circuit EDG1 is connected to the latch circuit DFF_0.

While the input signal of the input terminal IN is switched from the output signal of the latch circuit D_1 to the output signal of the latch circuit D_0, the edge detection circuit EDG1 of the determination unit 211 detects a rising edge at which an input signal is switched from the Low state (the logic value "0") to the High state (the logic value "1"). When the edge detection circuit EDG1 of the determination unit 211 detects the rising edge, the output signal of the output terminal Q0 of the latch circuit DFF_0 changes from the Low state to the High state and the output signal of the output terminal XQ0 of the latch circuit DFF_0 changes from the High state to the Low state, so that a signal in the Low state is input to the OR circuit OR1. At this time, since the output signal of the output terminal XQ1 of the latch circuit DFF_1 changes to the High state, the output signal OUT_OR of the OR circuit OR1 is in the High state.

Then, the first upper data signal held in the column counter 212 is transmitted to and held in the memory unit 223.

<Second Reading: FIG. 9>

Subsequently, at the time of second reading, a signal level corresponding to the amount of incident light of each unit pixel 202 is read. After the second reading from the unit pixel 202 of an arbitrary pixel row to the vertical signal line 203 is stabilized, the controller 220 supplies the ramp unit 214 with control data used to generate a ramp wave. The ramp unit 214 having received the control data outputs a ramp wave, which has a waveform temporally varying in a ramp shape as a whole, as a comparison voltage to be applied to the input terminal of the comparison unit 208. The comparison unit 208 starts to compare the ramp wave with the signal level. Furthermore, at this time, the controller 220 changes a start pulse, which is output to the ring-like delay circuit 217, from the Low state to the High state.

The comparison unit 208 compares the ramp wave applied from the ramp unit 214 with the signal level, and inverts the output signal CO when voltages of the ramp wave and the reset level approximately coincide (a first timing). The output signal CO is further inverted and delayed in the latch control unit 209 to be output (a second timing). At the first timing, based on the output signal CO of the comparison unit 208, the latch circuits D_0 to D_6 of the latch unit 210 change to the enable state. Furthermore, at the second timing, the output signal Hold_L of the latch control unit 209 and the output signal Hold_C of the AND circuit AND2 of the latch unit 210 are changed from the High state to the Low state. In this way, the latch circuits D_0 to D_7 of the latch unit 210 latch logic states corresponding to the output signals CK0 to CK7 of the delay units DU[0] to DU[7] as a second lower data signal. At this time, since the reduction of the power supply voltage and an increase in the ground voltage do not occur in the latch circuits D_0 to D_7, it is assumed that the latch circuits D_0 to D_6 operate for the delay time $t_{DLY1}$ of the inversion delay circuit DLY and accurately latch input signals. The logic states of the signals latched in the latch circuits D_0 to D_7 are $(10000111)_2$=(D_7=1, D_6=0, D_5=0, D_4=0, D_3=0, D_2=1, D_1=1, and D_0=1) ("0" corresponds to the Low state and "1" corresponds to the High state).

The column counter 212 latches a count value as a second upper data signal when the latch circuit D_7 of the latch unit 210 latches the output signal CK7. When a predetermined time lapses, the controller 220 allows the latch circuit D_7 to be in the disable state, and stops the supply of the control data to the ramp unit 214 and the output from the delay unit 216. In this way, the ramp unit 214 stops generation of the ramp wave.

Subsequently, the control signals SW7 to SW0 sequentially change from the Low state to the High state, so that the second lower data signal is transmitted to the memory unit 223. At this time, since the control signal Sig_SEL is in the High state, the switch circuit J_SW1 of the determination unit 211 changes to an OFF state and the switch circuit J_SW2 changes to an ON state, so that the edge detection circuit EDG1 is connected to the latch circuit DFF_1.

While the input signal of the input terminal IN is switched from the output signal of the latch circuit D_3 to the output signal of the latch circuit D_2, the edge detection circuit EDG1 of the determination unit 211 detects a rising edge at which an input signal is switched from the Low state (the logic value "0") to the High state (the logic value "1"). When the edge detection circuit EDG1 of the determination unit 211 detects the rising edge, the output signal of the output terminal Q1 of the latch circuit DFF_1 changes from the Low state to the High state and the output signal of the output terminal XQ1 of the latch circuit DFF_1 changes from the High state to the Low state, so that a signal in the Low state is input to the OR circuit OR1. At this time, since the input signals of both input terminals XQ1 of the OR circuit OR1 change to the Low state, the output signal OUT_OR of the OR circuit OR1 is in the Low state.

Subsequently, the second upper data signal held in the column counter 212 is transmitted to and held in the memory unit 223. Then, the horizontal selection unit 221 sequentially selects the determination units 211 of each column, so that the output signals Jout of the determination units 211 are sequentially output to the controller 220.

When the output signals Jout of the determination units 211 of all columns are in the Low state, since the latch circuits D_0 to D_7 accurately latch the output signals CK0 to CK7 of the delay units DU[0] to DU[7], the control signal DLY_SEL of the controller 220 is in the Low state and the delay times of the inversion delay circuits DLY of the latch control units 209 arranged in all the columns are tDLY1.

<Operation Process>

Digital data including the first and second lower data signals and the first and second upper data signals held in the memory units 223 is transmitted to the operation unit 222 by the horizontal selection unit 221 through the horizontal signal line 213. The operation unit 222 performs binarization and subtraction (CDS processing) based on the digital data output to the horizontal signal line 213. In this way, digital data of a signal component, which is the difference between the reset level and the signal level, is obtained.

Figure 10:
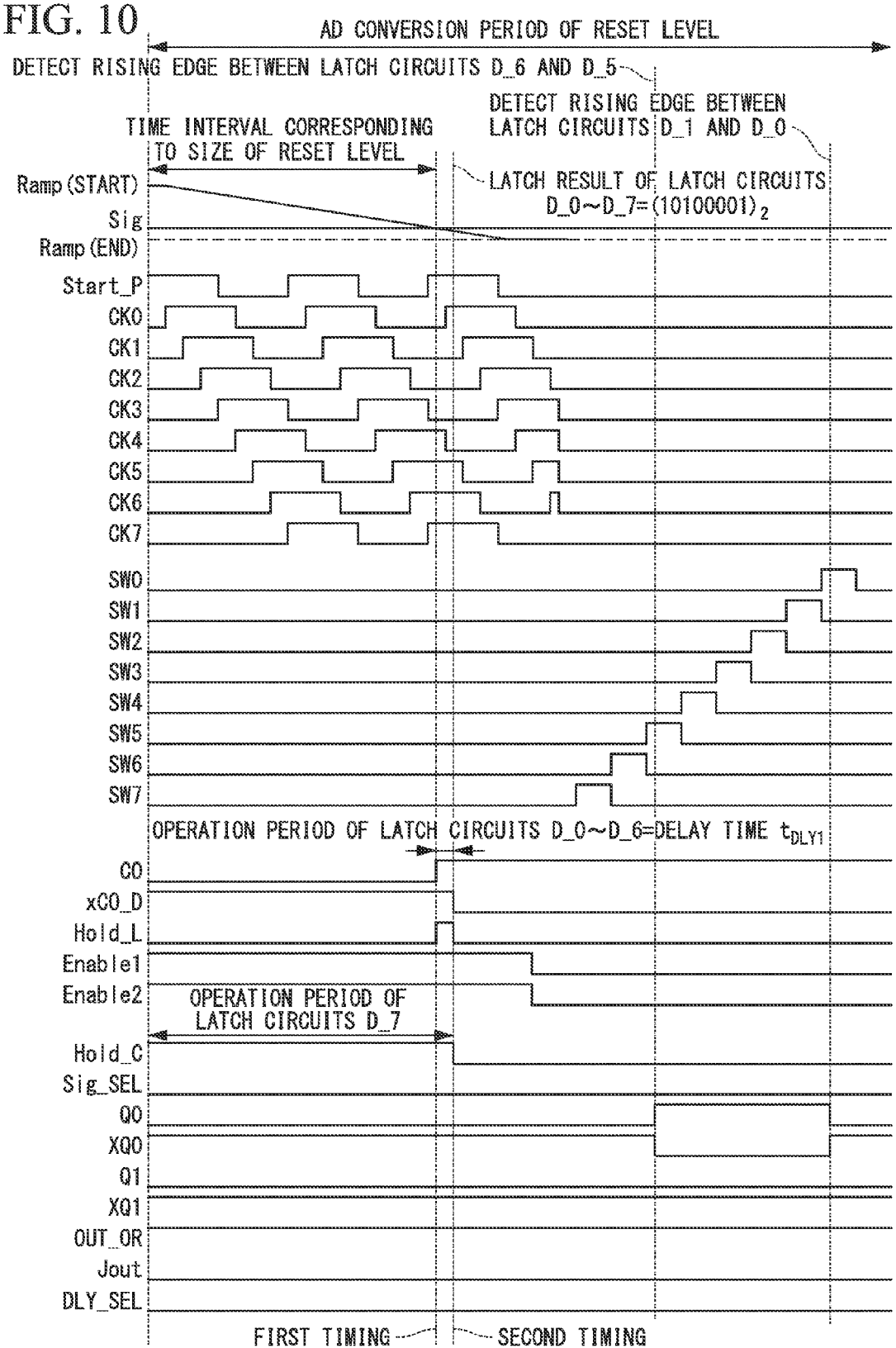
FIG. 10 is a timing chart illustrating the A/D conversion operation of a solid-state imaging device according to a second embodiment of the present invention.
Figure 11:
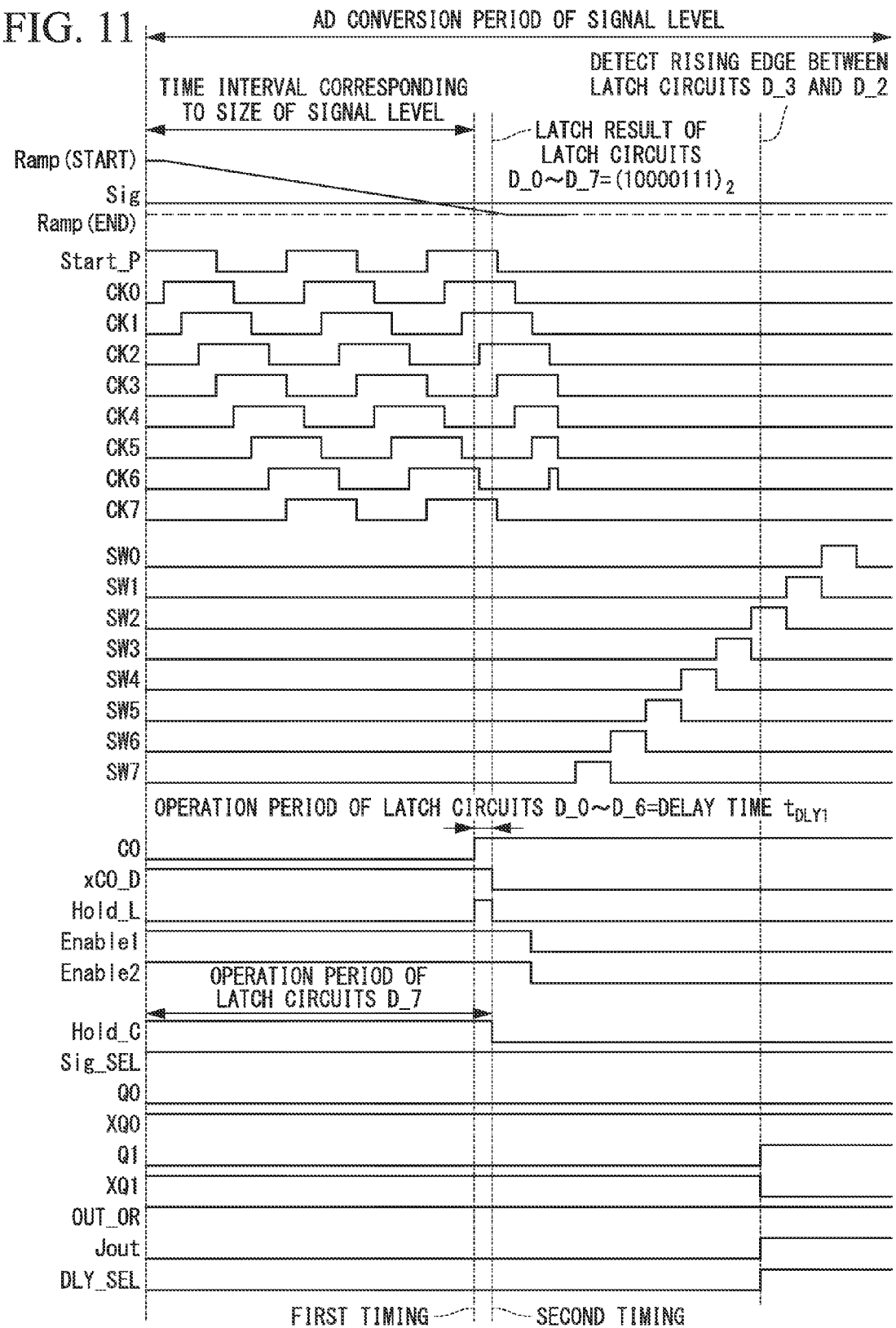
FIG. 11 is a timing chart illustrating the A/D conversion operation of a solid-state imaging device according to a second embodiment of the present invention.

Next, an operation when the reduction of the power supply voltage and an increase in the ground voltage has occurred in the latch circuits D_0 to D_7 will be described with reference to FIG. 10 and FIG. 11. In the present operation, since an operation until the latch circuits D_0 to D_7 latch the output signals CK0 to CK7 of the delay units DU[0] to DU[7] in a first read operation and a second read operation and an operation process are the same as the aforementioned operation, a description thereof will be omitted here.

<First Reading: FIG. 10>

At the second timing, the output signal Hold_L of the latch control unit 209 and the output signal Hold_C of the AND circuit AND2 of the latch unit 210 are changed from the High state to the Low state. In this way, the latch circuits D_0 to D_7 of the latch unit 210 latch logic states corresponding to the output signals CK0 to CK7 of the delay units DU[0] to DU[7] as a first lower data signal. At this time, due to the reduction of the power supply voltage and an increase in the ground voltage occurring in the latch circuits D_0 to D_7 as described above, it is assumed that the operations of the latch circuits D_0 to D_7 are delayed and the latch circuits D_0 to D_7 latch incorrect logic states. According to a detailed example, it is assumed that the latch circuit D_6 does not operate within the delay time $t_{DLY1}$ of the inversion delay circuit DLY, does not accurately latch the logic state "1," and latches the logic state "0," so that the logic states in the signals latched in the latch circuits D_0 to D_7 are $(10100001)_2$= (D_7=1, D_6=0, D_5=1, D_4=0, D_3=0, D_2=0, D_1=0, and D_0=1) ("0" corresponds to the Low state and "1" corresponds to the High state).

The column counter 212 latches a count value as a first upper data signal when the latch circuit D_7 of the latch unit 210 latches the output signal CK7. When a predetermined time lapses, the controller 220 allows the latch circuit D_7 to be in the disable state, and stops the supply of the control data to the ramp unit 214 and the output from the delay unit 216. In this way, the ramp unit 214 stops generation of the ramp wave.

Subsequently, the control signals SW7 to SW0 sequentially changes from the Low state to the High state, so that the first lower data signal is transmitted to the memory unit 223. At this time, since the control signal Sig_SEL is in the Low state, the switch circuit J_SW1 of the determination unit 211 changes to an ON state and the switch circuit J_SW2 changes to an OFF state, so that the edge detection circuit EDG1 is connected to the latch circuit DFF_0.

While the input signal of the input terminal IN is switched from the output signal of the latch circuit D_6 to the output signal of the latch circuit D_5 and is switched from the output signal of the latch circuit D_1 to the output signal of the latch circuit D_0, the edge detection circuit EDG1 of the determination unit 211 detects a rising edge two times, at which an input signal is switched from the Low state (the logic value "0") to the High state (the logic value "1"). When the edge detection circuit EDG1 of the determination unit 211 detects the rising edge between the output signal of the latch circuit D_6 and the output signal of the latch circuit D_5, the output signal of the output terminal Q0 of the latch circuit DFF_0 changes from the Low state to the High state and the output signal of the output terminal XQ0 of the latch circuit DFF_0 changes from the High state to the Low state, so that a signal in the Low state is input to the OR circuit OR1. At this time, since the output signal of the output terminal XQ1 of the latch circuit DFF_1 changes to the High state, the output signal OUT_OR of the OR circuit OR1 is in the High state.

Subsequently, when the edge detection circuit EDG1 of the determination unit 211 detects the rising edge between the output signal of the latch circuit D_1 and the output signal of the latch circuit D_0, the output signal of the output terminal Q0 of the latch circuit DFF_0 changes from the High state to the Low state and the output signal of the output terminal XQ0 of the latch circuit DFF_0 changes from the Low state to the High state, so that a signal in the High state is input to the OR circuit OR1. At this time, since the output signal of the output terminal XQ1 of the latch circuit DFF_1 changes to the High state, the output signal OUT_OR of the OR circuit OR1 is in the High state as is.

Then, the first upper data signal held in the column counter 212 is transmitted to and held in the memory unit 223.

<Second Reading: FIG. 11>

At the second timing, the output signal Hold_L of the latch control unit 209 and the output signal Hold_C of the AND circuit AND2 of the latch unit 210 are changed from the High state to the Low state. In this way, the latch circuits D_0 to D_7 of the latch unit 210 latch logic states corresponding to the output signals CK0 to CK7 of the delay units DU[0] to DU[7] as a second lower data signal. At this time, since the reduction of the power supply voltage and an increase in the ground voltage do not occur in the latch circuits D_0 to D_7, it is assumed that the latch circuits D_0 to D_6 operate for the delay time $t_{DLY1}$ of the inversion delay circuit DLY and accurately latch input signals. The logic states of the signals latched in the latch circuits D_0 to D_7 are $(10000111)_2$= (D_7=1, D_6=0, D_5=0, D_4=0, D_3=0, D_2=1, D_1=1, and D_0=1) ("0" corresponds to the Low state and "1" corresponds to the High state).

The column counter 212 latches a count value as a second upper data signal when the latch circuit D_7 of the latch unit 210 latches the output signal CK7. When a predetermined time lapses, the controller 220 controls to change the latch circuit D_7 to be in the disable state, and stops the supply of the control data to the ramp unit 214 and the output from the delay unit 216. In this way, the ramp unit 214 stops the generation of the ramp wave.

Subsequently, the control signals SW7 to SW0 sequentially change from the Low state to the High state, so that the second lower data signal is transmitted to the memory unit 223. At this time, since the control signal Sig_SEL is in the Low state, the switch circuit J_SW1 of the determination unit 211 changes to an OFF state and the switch circuit J_SW2 changes to an ON state, so that the edge detection circuit EDG1 is connected to the latch circuit DFF_1.

While the input signal of the input terminal IN is switched from the output signal of the latch circuit D_3 to the output signal of the latch circuit D_2, the edge detection circuit EDG1 of the determination unit 211 detects a rising edge at which an input signal is switched from the Low state (the logic value "0") to the High state (the logic value "1"). When the edge detection circuit EDG1 of the determination unit 211 detects the rising edge, the output signal of the output terminal Q1 of the latch circuit DFF_1 changes from the Low state to the High state and the output signal of the output terminal XQ1 of the latch circuit DFF_1 changes from the High state to the Low state, so that a signal in the Low state is input to the OR circuit OR1. At this time, since the output signal of the output terminal XQ0 of the latch circuit DFF_0 changes to the High state and the output signal of the output terminal XQ1 of the latch circuit DFF_1 changes to the Low state, the output signal OUT_OR of the OR circuit OR1 remains in the High state.

Subsequently, the second upper data signal held in the column counter 212 is transmitted to and held in the memory unit 223. Then, the horizontal selection unit 221 sequentially selects the determination units 211 of each column, so that the output signals Jout of the determination units 211 are sequentially output to the controller 220.

When the output signal Jout of the determination unit 211 of any one column is in the High state, since the latch circuits D_0 to D_7 accurately latch the output signals CK0 to CK7 of the delay units DU[0] to DU[7], the control signal DLY_SEL of the controller 220 is in the High state and the delay times of the inversion delay circuits DLY of the latch control units 209 arranged in all the columns are changed to tDLY2, so that AD conversion of a pixel signal of a next row is performed.

At this time, without performing the AD conversion of the pixel signal of the next row, the delay times of the inversion delay circuits DLY of the latch control units 209 may be changed to tDLY2, and then the same AD conversion may be performed again.

Through the aforementioned operation, in the following AD conversion operation, the output signal Hold_L of the latch control unit 209 changes to the High state and the latch circuits D_0 to D_6 change to the enable state, and then the output signal Hold_L of the latch control unit 209 and the output signal Hold_C of the AND circuit AND2 of the latch unit 210 change to the Low state. Subsequently, the period (the delay time of the inversion delay circuit DLY) until the latch circuits D_0 to D_7 latch the output signals CK0 to CK7 of the delay units DU[0] to DU[7] becomes long. Thus, even when the operations of the latch circuits D_0 to D_7 are delayed due to the reduction of the power supply voltage and an increase in the ground voltage occurring in the latch circuits D_0 to D_7, the latch circuits D_0 to D_6 operate within the delay time of the inversion delay circuit DLY and accurately latch the output signals CK0 to CK6 of the delay units DU[0] to DU[6].

According to the aforementioned configuration, it is determined whether the latch circuits D_0 to D_7 accurately latch the output signals CK0 to CK7 of the delay units DU[0] to DU[7], and the delay time of the inversion delay circuit DLY is set to be long when the latch circuits D_0 to D_7 do not accurately latch the output signals CK0 to CK7. In this way, the latch circuits D_0 to D_7 change to the enable state within the delay time of the inversion delay circuit DLY. Thus, the latch circuits D_0 to D_7 accurately latch the output signals CK0 to CK7 of the delay units DU[0] to DU[7], so that it is possible to minimize an increase in current consumption related to the AD conversion operation and to prevent the degree of accuracy of the AD conversion from being reduced.

Third Embodiment

Figure 12:
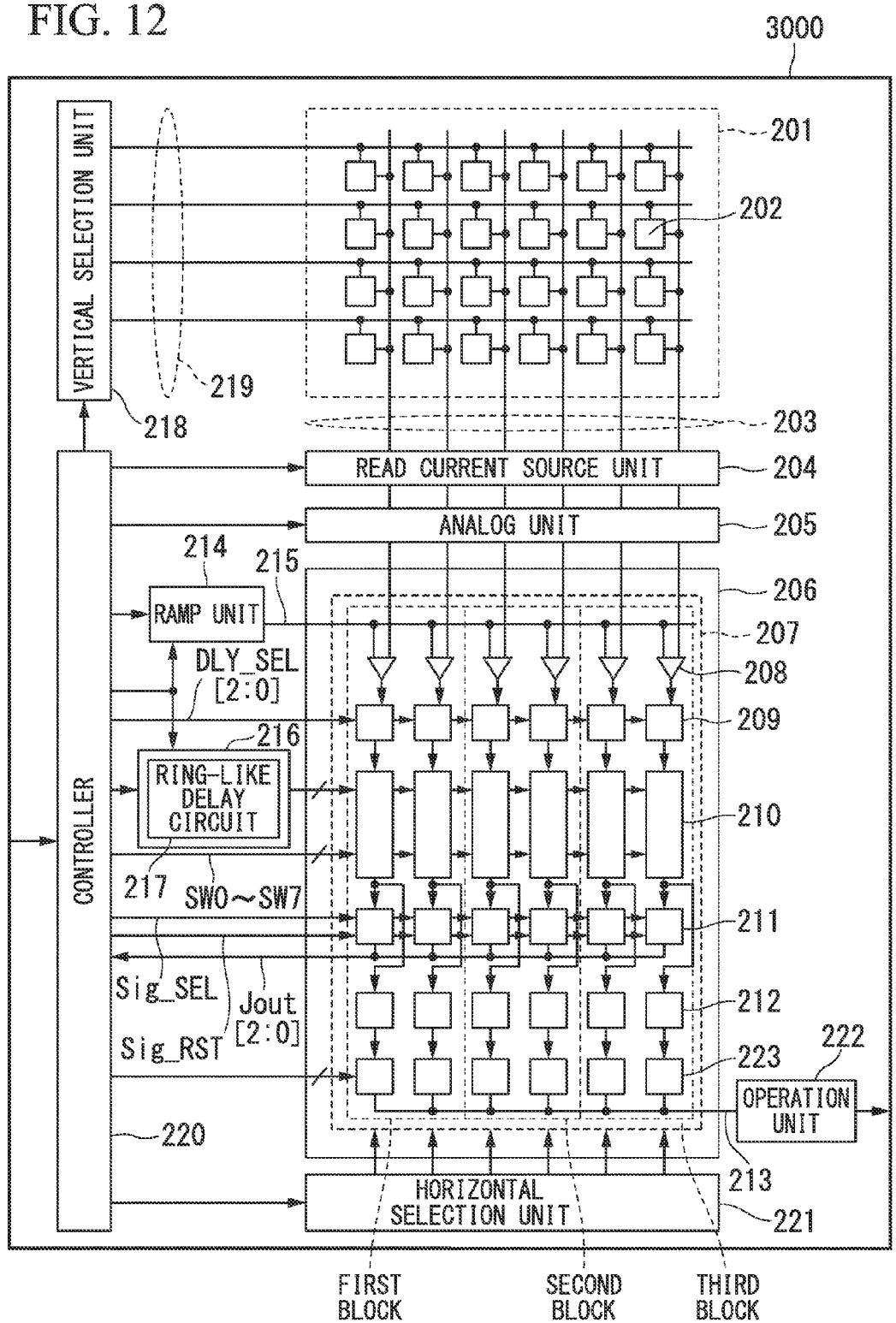
FIG. 12 is a block diagram illustrating the configuration of a solid-state imaging device according to a third embodiment of the present invention.

Next, a third embodiment of the present invention will be described. FIG. 12 illustrates an example of the configuration of a solid-state imaging device according to the present embodiment. In each configuration used in FIG. 12, the same reference numerals are used to designate the same elements as those of FIG. 6, and a description thereof will be omitted here. Hereinafter, each configuration of the present embodiment will be described while focusing on differences from the second embodiment.

In a solid-state imaging device 300 illustrated in FIG. 12, the ADC unit 207 is divided into three blocks (a first block, a second block, and a third block) every two columns, output signals Jout of the determination units 211 are individually output from the respective blocks, and control signals DLY_SEL are individually output to the respective blocks. In FIG. 12, the output signals Jout from the three blocks are indicated as Jout[2:0] and the control signals DLY_SEL to the three blocks are indicated as DLY_SEL[2:0].

In the solid-state imaging device 300 illustrated in FIG. 12, the output signal Jout of the determination unit 211 corresponding to the first block is the output signal Jout[2], and the control signal DLY_SEL to the inversion delay circuit DLY is the control signal DLY_SEL[2]. The output signal Jout of the determination unit 211 corresponding to the second block is the output signal Jout[1], and the control signal DLY_SEL to the inversion delay circuit DLY is the control signal DLY_SEL[1]. Furthermore, the output signal Jout of the determination unit 211 corresponding to the third block is the output signal Jout[0], and the control signal DLY_SEL to the inversion delay circuit DLY is the control signal DLY_SEL[0].

Based on the output signal Jout of the determination unit 211 of each block, the controller 220 controls the control signal DLY_SEL of a corresponding block, and changes the delay time of the inversion delay circuit DLY.

Since an AD conversion operation in the present embodiment is the same as the operation described in the second embodiment, a description thereof will be omitted here.

According to the aforementioned configuration, in the blocks from the first block to the third block, it is determined whether the latch circuits D_0 to D_7 accurately latch the output signals CK0 to CK7 of the delay units DU[0] to DU[7], and when the latch circuits D_0 to D_7 do not accurately latch the output signals CK0 to CK7, the delay time of the inversion delay circuit DLY is set to be long only for a block for which accurate latching is not performed. Thus, since the operation times of latch circuits of blocks in which the output signals CK0 to CK7 of the delay units DU[0] to DU[7] are accurately latched do not become long, it is possible to suppress an increase in current consumption related to the latch operation, as compared with the second embodiment.

In the present embodiment, the ADC unit 207 has a configuration in which the total of three blocks are arranged every two columns. However, this is for illustrative purposes only, and the present invention is not limited to the configuration. For example, it may be possible to employ a configuration in which a total of two blocks of the ADC unit 207 are arranged every three columns, or a configuration in which a total of two blocks of the ADC unit 207 including a block having four columns and a block having two columns are arranged.

Fourth Embodiment

Figure 13:
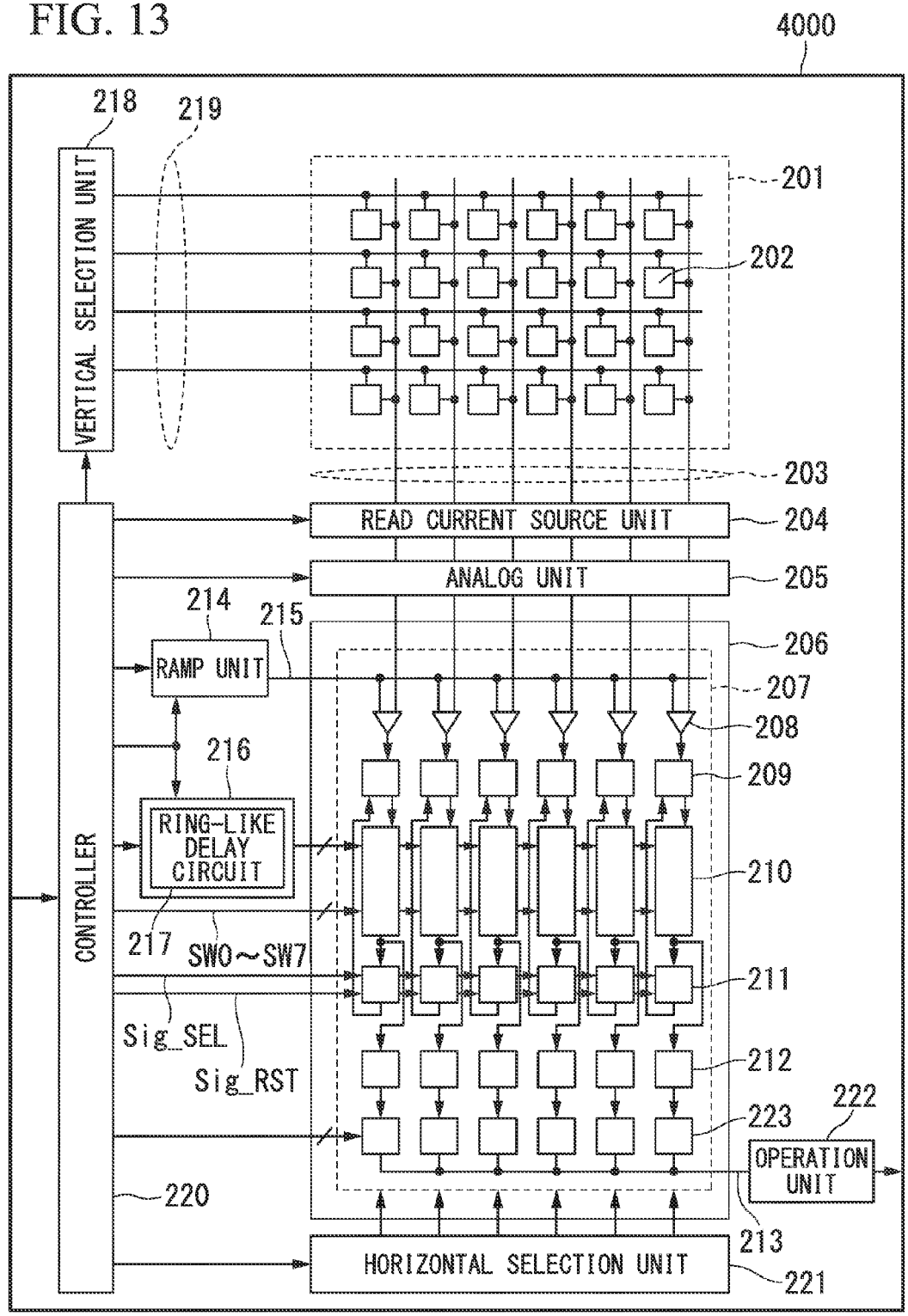
FIG. 13 is a block diagram illustrating the configuration of a solid-state imaging device according to a fourth embodiment of the present invention.
Figure 14:
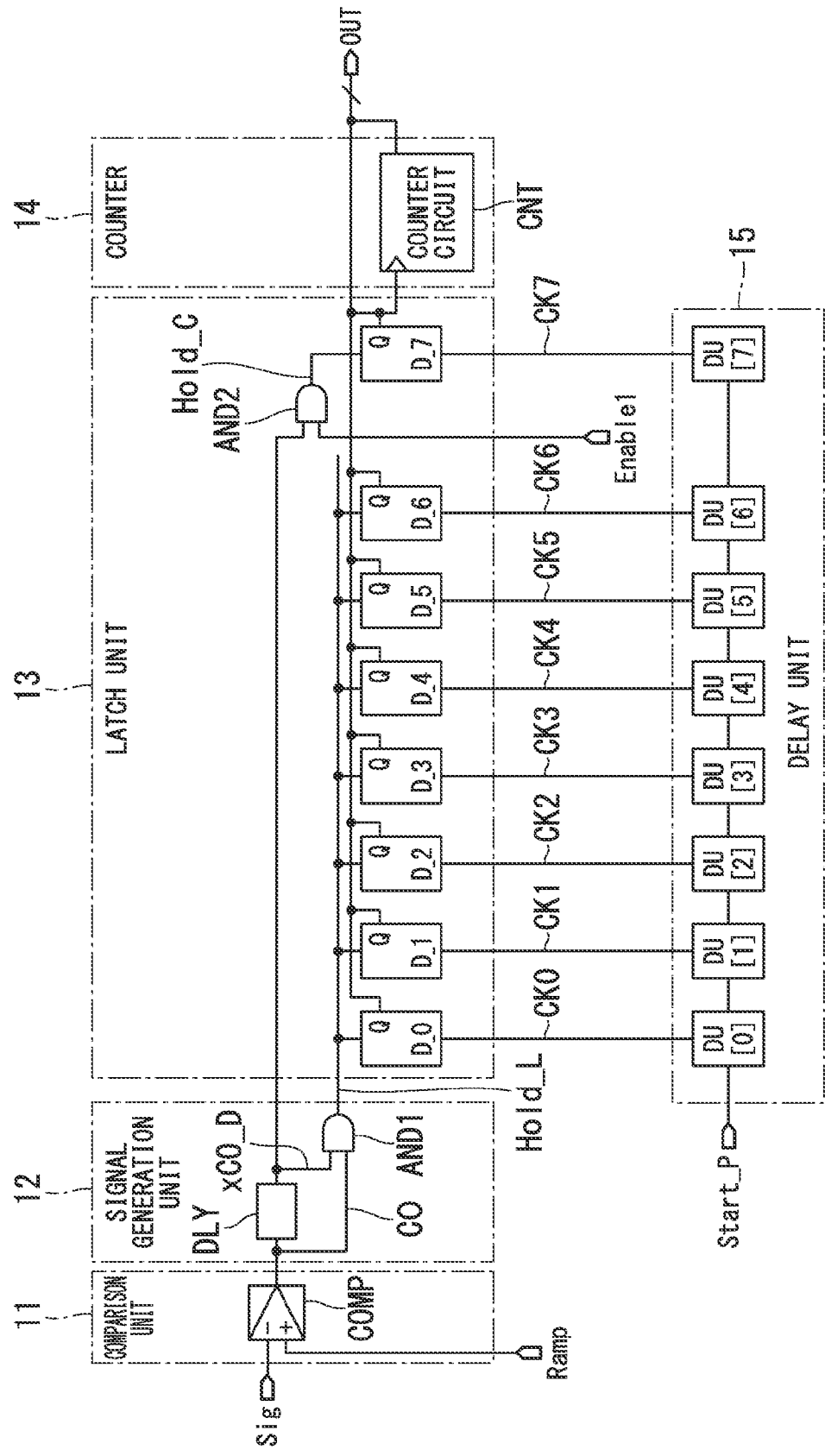
FIG. 14 is a circuit diagram illustrating the configuration of an A/D conversion circuit according to the related art.
Figure 15:
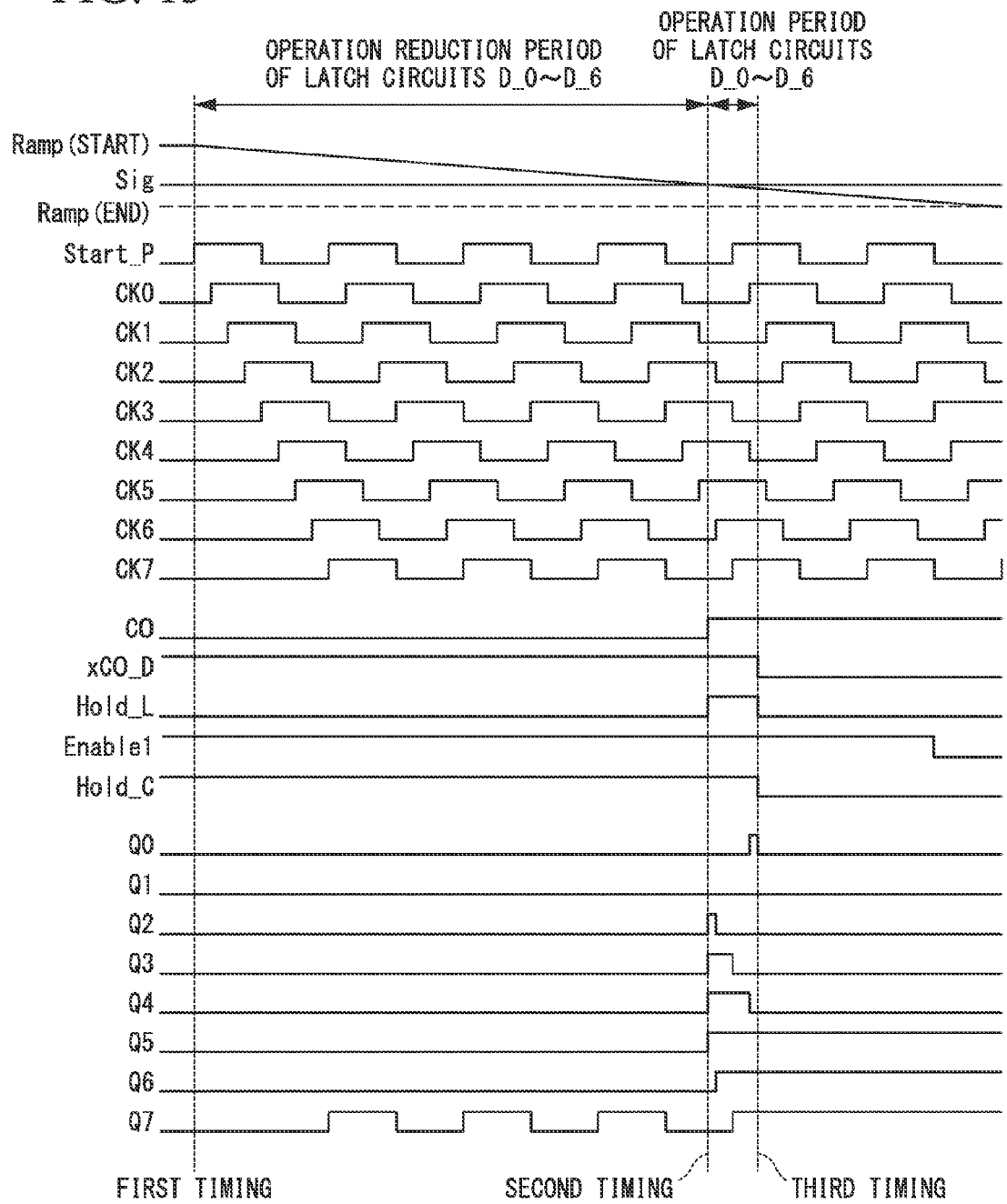
FIG. 15 is a timing chart illustrating the operation of an A/D conversion circuit according to the related art.

Next, a fourth embodiment of the present invention will be described. FIG. 13 illustrates an example of the configuration of a solid-state imaging device according to the present embodiment. In each configuration used in FIG. 13, the same reference numerals are used to designate the same elements as those of FIG. 6 and FIG. 12, and a description thereof will be omitted. Hereinafter, each configuration of the present embodiment will be described while focusing on differences from the second embodiment and the third embodiment.

In a solid-state imaging device 4000 illustrated in FIG. 13, in each column, the determination unit 211 of the ADC unit 207 outputs the output signal Jout to the latch control unit 209. In this way, the delay time of the inversion delay circuit DLY of the latch control unit 209 is set in each column.

Since an AD conversion operation in the present embodiment is the same as the operation described in the second embodiment, a description thereof will be omitted here.

According to the aforementioned configuration, it is determined whether the latch circuits D_0 to D_7 accurately latch the output signals CK0 to CK7 of the delay units DU[0] to DU[7] in each column, and when the latch circuits D_0 to D_7 do not accurately latch the output signals CK0 to CK7, the delay time of the inversion delay circuit DLY is set to be long only for a column for which accurate latching is not performed. Thus, since the operation times of the latch circuits of columns in which the output signals CK0 to CK7 of the delay units DU[0] to DU[7] are accurately latched do not become long, it is possible to suppress an increase in current consumption related to the latch operation, as compared with the second embodiment and the third embodiment.

In the first embodiment to the fourth embodiment, two delay times of the inversion delay circuit DLY, $t_{DLY1}$ and $t_{DLY2}$, have been described. However, the delay times of the inversion delay circuit DLY may be set to three values or more.

In the foregoing description, embodiments of the present invention have been described. However, the present invention is not limited to the embodiments. The present invention may be subject to additions, omissions, replacements, and other modifications of the configuration in a range not departing from the spirit of the present invention.

What is claimed is:

1. An A/D conversion circuit comprising:
   a comparison unit configured to receive an analog signal and a reference signal that increases or decreases with lapse of time, to compare the analog signal with the reference signal, and to output a first comparison signal at a first timing at which the analog signal and the reference signal have a predetermined relation;
   a signal generation unit configured to output a second comparison signal, a logic state of which changes, at a second timing at which a predetermined time has lapsed from the first timing, and to output a third comparison signal, a logic state of which changes, at the first timing and the second timing based on a result obtained by performing a logic operation on the first comparison signal and the second comparison signal;
   a clock generation unit configured to output n clock signals from a first clock signal to an n-th (where n is a natural number greater than or equal to 2) clock signal, which have different phases from each other;
   a latch unit that includes n latch units from a first latch unit to an n-th latch unit, each latch unit having a first input terminal to which a corresponding one of the n clock signals from the first clock signal to the n-th clock signal is input, a second input terminal to which a control signal entering a first logic state corresponding to a valid state of a latch unit and a second logic state corresponding to an invalid state of a latch unit is input based on the second comparison signal or the third comparison signal, and an output terminal;
   a counter configured to perform counting based on a signal from the one output terminal of k latch units from an (n−k+1)th (where k is a natural number greater than or equal to 1 and smaller than or equal to n−1) latch unit to the n-th latch unit;
   a determination unit configured to determine a logic state of the clock signal latched in the latch unit based on at least one of signals from the output terminals of (n−k) latch units from the first latch unit to an (n−k)th latch unit, and to output a determination signal; and
   a time controller configured to control a length of the predetermined time based on the determination signal,
   wherein the control signal, which is input to the (n−k) latch units from the first latch unit to the (n−k)th latch unit, is in the second logic state from a timing according to comparison start in the comparison unit to the first timing based on the third comparison signal, and is in the first logic state from the first timing to the second timing based on the third comparison signal, a control signal, which is input to the k latch units from the (n−k+1)th latch unit to the n-th latch unit, is in the first logic state from the timing according to the comparison start in the comparison unit to the second timing based on the second comparison signal, and the n latch units from the first latch unit to the n-th latch unit latch logic states of the n clock signals at the second timing.

2. A solid-state imaging device comprising:
   an imaging unit that includes a plurality of pixels arranged in a matrix form to output a pixel signal in response to an amount of incident light; and
   the A/D conversion circuits according to claim 1 that are arranged for each column or each of a plurality of columns of the imaging unit, the analog signal being a signal corresponding to the pixel signal,
   wherein the time controller controls a length of the predetermined time of all columns based on the determination signal.

3. A solid-state imaging device comprising:
   an imaging unit that includes a plurality of pixels arranged in a matrix form to output a pixel signal in response to an amount of incident light; and
   the A/D conversion circuits according to claim 1 that are arranged for each column or each of a plurality of columns of the imaging unit, the analog signal being a signal corresponding to the pixel signal,
   wherein the time controller controls a length of the predetermined time of the A/D conversion circuits of the plurality of columns, which include a column from which the determination signal is output, based on the determination signal.

4. A solid-state imaging device comprising:
   an imaging unit that includes a plurality of pixels arranged in a matrix form to output a pixel signal in response to an amount of incident light; and
   the A/D conversion circuits according to claim 1 that are arranged for each column or each of a plurality of columns of the imaging unit, the analog signal being a signal corresponding to the pixel signal,
   wherein the time controller controls a length of the predetermined time of the A/D conversion circuits of a column, from which the determination signal is output, based on the determination signal.

* * * * *